(12) United States Patent
Bonekamp et al.

(10) Patent No.: US 11,898,023 B2
(45) Date of Patent: Feb. 13, 2024

(54) POLYOLEFIN PHOTOVOLTAIC BACKSHEET COMPRISING A STABILIZED POLYPROPYLENE LAYER

(71) Applicant: Dow Global Technologies LLC, Midland, MI (US)

(72) Inventors: Jeffrey E. Bonekamp, Midland, MI (US); Huiqing Zhang, Midland, MI (US); Fanny Deplace, Lake Jackson, TX (US)

(73) Assignee: Dow Global Technologies LLC, Midland, MI (US)

( * ) Notice: Subject to any disclaimer, the term of this patent is extended or adjusted under 35 U.S.C. 154(b) by 517 days.

(21) Appl. No.: 17/130,920

(22) Filed: Dec. 22, 2020

(65) Prior Publication Data

US 2021/0115223 A1   Apr. 22, 2021

Related U.S. Application Data

(63) Continuation of application No. 15/320,418, filed as application No. PCT/US2015/033908 on Jun. 3, 2015, now abandoned.

(60) Provisional application No. 62/016,251, filed on Jun. 24, 2014.

(51) Int. Cl.

| | | |
|---|---|---|
| C08L 23/12 | (2006.01) | |
| H01L 31/049 | (2014.01) | |
| C08K 5/3435 | (2006.01) | |
| C08K 5/3492 | (2006.01) | |
| C08L 23/10 | (2006.01) | |
| C08L 23/16 | (2006.01) | |
| C08K 5/36 | (2006.01) | |
| C08K 5/3432 | (2006.01) | |
| C08L 51/06 | (2006.01) | |
| C08K 5/3472 | (2006.01) | |
| C08L 23/08 | (2006.01) | |
| C08K 5/00 | (2006.01) | |
| C08K 5/101 | (2006.01) | |
| C08K 5/3462 | (2006.01) | |
| C08K 5/372 | (2006.01) | |
| H01L 31/048 | (2014.01) | |

(52) U.S. Cl.
CPC ............ *C08K 5/3435* (2013.01); *C08K 5/005* (2013.01); *C08K 5/101* (2013.01); *C08K 5/3432* (2013.01); *C08K 5/3462* (2013.01); *C08K 5/3472* (2013.01); *C08K 5/3492* (2013.01); *C08K 5/36* (2013.01); *C08K 5/372* (2013.01); *C08L 23/0815* (2013.01); *C08L 23/10* (2013.01); *C08L 23/16* (2013.01); *C08L 51/06* (2013.01); *H01L 31/049* (2014.12); *H01L 31/0481* (2013.01); *C08J 2323/10* (2013.01); *C08L 2205/025* (2013.01); *Y02E 10/50* (2013.01)

(58) Field of Classification Search
CPC .... H01L 31/049; H01L 31/0481; C08L 23/10; C08L 23/0815; C08L 23/16; C08L 51/06; C08L 2205/025; C08K 5/005; C08K 5/3435; C08K 5/3492; C08K 5/3432; C08K 5/3472; C08K 5/36; Y02E 10/50; C08J 2323/10; B32B 27/32; B32B 27/18
See application file for complete search history.

(56) References Cited

U.S. PATENT DOCUMENTS

| | | | |
|---|---|---|---|
| 3,236,917 A | 2/1966 | Giulio et al. | |
| 3,502,613 A * | 3/1970 | Berger ................. | D06M 13/02 |
| | | | 524/304 |
| 3,557,265 A | 1/1971 | Chisolm et al. | |
| 3,565,985 A | 2/1971 | Schrenk et al. | |
| 3,884,606 A | 5/1975 | Schrenk | |
| 4,842,791 A | 6/1989 | Gould | |
| 4,950,541 A | 8/1990 | Tabor et al. | |
| 5,094,788 A | 3/1992 | Schrenk et al. | |
| 5,094,793 A | 3/1992 | Schrenk et al. | |
| 5,194,509 A | 3/1993 | Hasenbein et al. | |
| 5,214,084 A | 5/1993 | Ishii et al. | |
| 5,272,236 A | 12/1993 | Lai et al. | |
| 5,278,272 A | 1/1994 | Lai et al. | |
| 5,844,045 A | 12/1998 | Kolthammer et al. | |
| 5,869,575 A | 2/1999 | Kolthammer et al. | |

(Continued)

FOREIGN PATENT DOCUMENTS

| | | |
|---|---|---|
| EP | 0449685 A1 | 10/1991 |
| WO | 2011/020760 A1 | 2/2011 |

(Continued)

OTHER PUBLICATIONS

Cytec Industries; Cyasorb UV-3346 and Cyasorb UV-3529 Properties; accessed and printed Feb. 27, 2020; pp. 1-4 (Year: 1999).

(Continued)

*Primary Examiner* — Karuna P Reddy
(74) *Attorney, Agent, or Firm* — Boyle Fredrickson, S.C.

(57) ABSTRACT

Polyolefin photovoltaic (PV) backsheets comprise a polypropylene layer stabilized with (A) at least one hindered amine with 2,2,6,6-tetraalkylpiperdine or 2,2,6,6 -tetraakylpiperazinone, either or both in combination with a triazine moiety, (B) a thioester, and, optionally, (C) at least one hindered hydroxybenzoate, and/or (D) an ortho hydroxyl triazine compound. These PV backsheets exhibit a low flame spread index of <100 without the use of FR agents, and the polypropylene layer exhibits good weatherability while providing the required long term heat aging performance necessary for PV modules.

19 Claims, 1 Drawing Sheet

(56) References Cited

U.S. PATENT DOCUMENTS

| | | |
|---|---|---|
| 5,986,028 A | 11/1999 | Lai et al. |
| 6,051,164 A | 4/2000 | Samuels |
| 6,187,448 B1 | 2/2001 | Hanoka et al. |
| 6,353,042 B1 | 3/2002 | Hanoka et al. |
| 6,448,641 B2 | 9/2002 | Kolthammer et al. |
| 6,538,070 B1 | 3/2003 | Cardwell et al. |
| 6,545,088 B1 | 4/2003 | Kolthammer et al. |
| 6,566,446 B1 | 5/2003 | Parikh et al. |
| 6,586,271 B2 | 7/2003 | Hanoka |
| 6,685,872 B2 | 2/2004 | Dooley et al. |
| 6,843,939 B2 | 1/2005 | Stretanski et al. |
| 7,355,089 B2 | 4/2008 | Chang et al. |
| 7,485,745 B2 | 2/2009 | Maas et al. |
| 7,759,417 B2 | 7/2010 | Zenner et al. |
| 7,993,739 B2 | 8/2011 | Barger et al. |
| 8,097,753 B2 | 1/2012 | Maas et al. |
| 8,562,885 B2 | 10/2013 | Dooley et al. |
| 8,785,554 B2 | 7/2014 | Li Pi Shan et al. |
| 8,822,598 B2 | 9/2014 | Li Pi Shan et al. |
| 8,822,599 B2 | 9/2014 | Li Pi Shan et al. |
| 9,481,143 B2 | 11/2016 | Dooley et al. |
| 2001/0045229 A1 | 11/2001 | Komori et al. |
| 2002/0038664 A1 | 4/2002 | Zenko et al. |
| 2003/0162868 A1 | 8/2003 | Stretanski et al. |
| 2006/0199006 A1 | 9/2006 | Poon et al. |
| 2006/0199030 A1 | 9/2006 | Liang et al. |
| 2006/0199744 A1 | 9/2006 | Walton et al. |
| 2006/0199872 A1 | 9/2006 | Prieto et al. |
| 2006/0199884 A1 | 9/2006 | Hoenig et al. |
| 2006/0199887 A1 | 9/2006 | Liang et al. |
| 2006/0199896 A1 | 9/2006 | Walton et al. |
| 2006/0199897 A1 | 9/2006 | Kuechler et al. |
| 2006/0199905 A1 | 9/2006 | Hughes et al. |
| 2006/0199906 A1 | 9/2006 | Walton et al. |
| 2006/0199908 A1 | 9/2006 | Cheung et al. |
| 2006/0199910 A1 | 9/2006 | Fuchs et al. |
| 2006/0199911 A1 | 9/2006 | Markovich et al. |
| 2006/0199912 A1 | 9/2006 | Fuchs et al. |
| 2006/0199914 A1 | 9/2006 | Harris et al. |
| 2006/0199930 A1 | 9/2006 | Li Pi Shan et al. |
| 2006/0199931 A1 | 9/2006 | Poon et al. |
| 2006/0199983 A1 | 9/2006 | Kammerhofer et al. |
| 2007/0167578 A1 | 7/2007 | Arriola et al. |
| 2007/0213563 A1 | 9/2007 | Maas et al. |
| 2008/0311812 A1 | 12/2008 | Arriola et al. |
| 2010/0108128 A1 | 5/2010 | Chu et al. |
| 2010/0144935 A1 | 6/2010 | Roth et al. |
| 2010/0197880 A1 | 8/2010 | Shan et al. |
| 2011/0027553 A1 | 2/2011 | Enniss et al. |
| 2011/0082249 A1 | 4/2011 | Shan et al. |
| 2011/0082257 A1 | 4/2011 | Carnahan et al. |
| 2011/0082258 A1 | 4/2011 | Walton et al. |
| 2011/0100438 A1 | 5/2011 | Gaston et al. |
| 2011/0118416 A1 | 5/2011 | Arriola et al. |
| 2011/0313108 A1 | 12/2011 | Shan et al. |
| 2012/0108709 A1 | 5/2012 | Schoening et al. |
| 2012/0108711 A1 | 5/2012 | Sala et al. |
| 2012/0111407 A1* | 5/2012 | Rummens ............. H01L 31/049 428/327 |
| 2012/0145241 A1 | 6/2012 | Fujiki |
| 2014/0137938 A1* | 5/2014 | Takegami ............... B32B 27/20 136/256 |
| 2014/0174509 A1* | 6/2014 | Bonekamp ............ B29C 41/003 136/251 |
| 2016/0134231 A1 | 5/2016 | Wu et al. |

FOREIGN PATENT DOCUMENTS

| | | | |
|---|---|---|---|
| WO | 2011/163187 A1 | 12/2011 | |
| WO | 2011/163189 A1 | 12/2011 | |
| WO | 2011/163191 A1 | 12/2011 | |
| WO | WO-2013003541 A1 * | 1/2013 | ............ B29C 41/003 |
| WO | WO-2013008917 A1 * | 1/2013 | ............ B32B 27/08 |
| WO | 2014/205802 A1 | 12/2014 | |

OTHER PUBLICATIONS

Chemical Book; Ultraviolet Absorbent UV-1164; http://www.chemicalbook.com/ChemicalProductProperty_EN_CB9842162.htm; accessed and printed Aug. 30, 2018 (Year: 2018).

SCIENCOC; Light Stabilizer UV-3853; http://www.scienoc.com/light_stabilizer_uv_3853; accessed and printed Aug. 29, 2018 (Year: 2018).

* cited by examiner

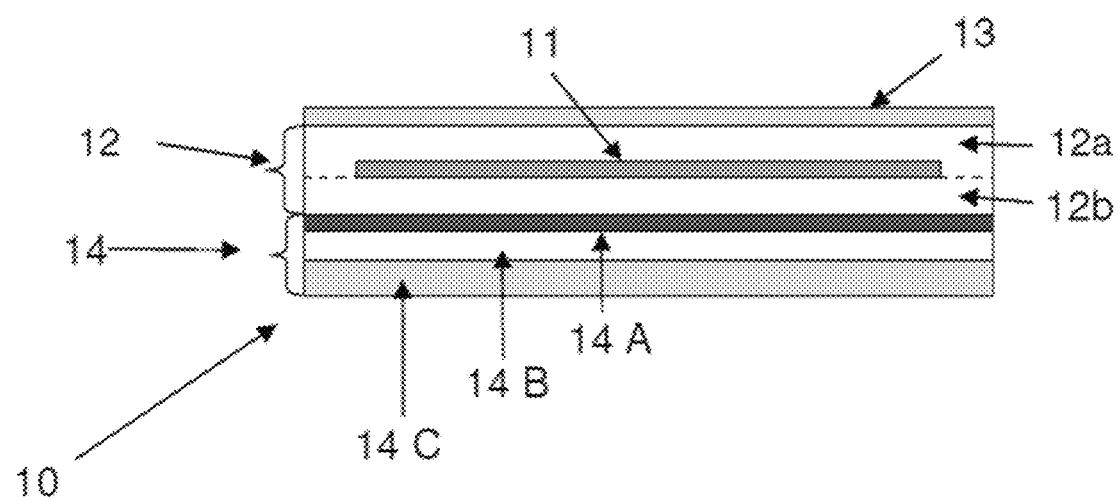

POLYOLEFIN PHOTOVOLTAIC BACKSHEET COMPRISING A STABILIZED POLYPROPYLENE LAYER

FIELD OF THE INVENTION

This invention relates to photovoltaic (PV) modules or cells. In one aspect the invention relates to PV module backsheets while in another aspect, the invention relates to PV module backsheets comprising polypropylene. In yet another aspect the invention relates to PV module backsheets comprising polypropylene and an additive package for stabilizing the backsheet against UV/visible light degradation and heat aging while imparting flame resistance without the use of flame retardant additives.

BACKGROUND OF THE INVENTION

U.S. Pat. Nos. 7,759,417, 6,051,164, 6,867,250 and 6,843,939 teach protection of polyolefins against degradation by UV/visible light, heat and oxidation through the use of various (1) hindered amine light stabilizers (HALS) such as ortho-tris-aryl triazine light absorbers, hindered hydroxyl benzoates, nickel quenchers (e.g., nickel phenolate), etc., and (2) antioxidants such as hindered phenol, hindered arylalkyl phosphite, and trisarylphosphite. However, these references do not teach that HALS and/or antioxidants impart flame resistance to a polyolefin.

The combination of a thioester (a secondary antioxidant) with a hindered phenol (a primary antioxidant) can be synergistic providing longer term heat stabilization (Gachter/Muller, *Plastics Additives Handbook*, Hanser Publishers, 1993). However, thioester used in the presence of HALS can also decrease effectiveness of the HALS due to its interaction with the degradation byproducts of the thioester. This results in poor weathering of the polyolefin (*Polymeric Materials Encyclopedia*: P, Vol. 8, 1996, p. 5994 and J. Sedlar, J. Marchal, J. Petruj, *Polymer Photochemistry* Vol. 2, Issue 3, May 1982, Pages 175-207, p 200).

Some flame retardants (FR), such as halogenated FR, that are typically used to achieve effective low flame spread, also commonly have a deleterious effect on the UV stability provided by HALS (Robert L. Gray, Robert E. Lee and Brent M. Sanders, *Journal of Vinyl and Additive Technology*, Vol. 2, Issue 1, pages 63-68, March 1996). Some hindered amines, e.g., N-alkoxy or NOR HALS, can enhance UV stability in the presence of FR due to lower basicity of NOR HALS and a reduction in the negative impact of FR on the HALS. However, typically, both FR and NOR HALS are needed to achieve flame retardancy (see, for example, U.S. Pat. No. 5,393,812) Useful inorganic FR typically require very high loadings (up to 60 weight percent (wt %)) of the composition to be effective, and they can negatively impact the mechanical properties or the processability of the composition and/or an article made from the composition.

Some halogenated, hindered amines provide flame retardant efficacy as well as UV stability to polyolefin fibers and thin films (see EP 1 462 481 or US 2012/0108709). It can be combined with UV-absorbers or other non-interaction HALS to further improve UV stability of the final article. However, these additives are known to cause discoloration of polypropylene (Aubert M, et al, *Polymer Degradation and Stability*, 96 (2011) 328-333) and there is no evidence for good long term heat aging (LTHA) which is critical for certification of PV modules. Similarly, BASF discloses other organic-based FR agents such as AZO or AZONOR (described, for example, in US 2010/0144935) but these too do not provide good LTHA or UV stabilization.

An organic-based FR comprising phosphinic acids, salts and ester additives (see, for example, U.S. Pat. Nos. 8,097,753, 7,485,745 and US 2007/0213563) can achieve good flame retardancy but this too does not provide UV or LTHA stabilization. Other non-halogenated flame retardant agents can provide some flame retardancy and UV stability, but impart a high degree of yellowness (as recorded by the yellowness index) and do not provide significant LTHA stabilization.

There is a need to provide PV modules with long term UV/light stability, long term heat aging and flame resistance without the use of FR additives. Specifically, there is a need for a low cost, PV backsheet or, at the least, one layer of a PV backsheet, that exhibits (1) low flame spread of <100 as measured by ASTM E162-02a, (2) long term heat aging of greater than 105° C. as measured by Relative Thermal Index (RTI) and tested by a UL 746B standard and reflected in retention of tensile strength as measured by ASTM D882 after aging at high temperatures (e.g., 150° C.), and (3) UV stability of greater than (>) 1000 hours as reflected in >70% retention of tensile properties and good color retention (e.g., YI less than (<) 5) in Xenon Arc exposure (IEC 61730, ASTM D2565, ASTM G151, ASTM G155) or alternatively in QUV exposure (ASTM G154). This combination of LTHA, UV and FR properties is necessary for certification by the International Electrotechnical Commission (IEC) and Underwriters Laboratories (UL) in polyolefin PV Backsheet composite films used to construct PV modules.

SUMMARY OF THE INVENTION

In one embodiment the invention is a polyolefin PV backsheet comprising a polypropylene layer stabilized with (A) at least one hindered amine with 2,2,6,6-tetraalkylpiperdine or 2,2,6,6-tetraakylpiperazinone, either or both in combination with a triazine moiety, (B) a thioester, and, optionally, (C) at least one hindered hydroxybenzoate, and/or (D) an ortho hydroxyl triazine compound. Exemplary triazine moieties include those as described in U.S. Pat. No. 6,843,939, preferably the (i) oligomeric, (ii) polymeric, or (iii) triazines having a weight average molecular weight (Mw) of at least 500. This stabilized polypropylene layer exhibits a low flame spread index of <100 without the use of FR agents, and good weatherability while providing the required long term heat aging performance necessary for a successful PV module as described above.

In one embodiment the invention is a multilayer PV backsheet which, in addition to comprising a polypropylene layer stabilized as stated above, also comprises (I) at least one additional layer comprising a polyolefin other than polypropylene stabilized with (A) at least one hindered amine with 2,2,6,6-tetraalkylpiperdine or 2,2,6,6-tetraakylpiperazinone, either or both in combination with a triazine moiety, (B) at least one hindered hydroxybenzoate, and optionally, (C) an ortho hydroxyl triazine compound, and (II) at least one polypropylene layer stabilized with (A) at least one hindered amine with 2,2,6,6-tetraalkylpiperdine or 2,2,6,6-tetraakylpiperazinone, either or both in combination with a triazine moiety, (B) a thioester, and, optionally, (C) at least one hindered hydroxybenzoate and/or (D) an ortho hydroxyl triazine compound.

In another embodiment, an integrated backsheet can be used to make a PV module where such an integrated backsheet comprises a back encapsulant tie layer bonded to a backsheet or bonded to one or more layers of a backsheet where such a backsheet comprises a polypropylene layer stabilized as described above. The above back encapsulant layer preferably comprises a polyolefin.

Optionally, one of the layers of the PV backsheet described in the above embodiments can comprise at least one of (1) a non-halogenated organic or inorganic compound, (2) a halogenated, nonphosphorus organic compound, (3) a halogenated phosphorous compound, or (4) an anti-drip agent. These PV backsheets exhibit a low flame spread index of <100, and good weatherability while providing the required long term heat aging performance necessary for a successful PV module.

In one embodiment the polypropylene layer further comprises at least one of an acid scavenger, metal deactivator, primary antioxidant (such as a hindered phenol), and a secondary antioxidant (such as a hindered arylalkyl phosphate or trisarylphosphite).

In one embodiment the polyolefin PV backsheet comprises a 3 layer structure in which the two outer or exterior layers are joined together by a middle or tie layer. At least one of the two outer layers is a polypropylene layer stabilized as described above.

In one embodiment the polyolefin PV integrated backsheet comprises a multilayer structure in which an outer layer comprising polypropylene is bonded to an encapsulant layer comprising a polyolefin, optionally using a tie layer.

In one embodiment the polyolefin PV backsheet or integrated backsheet is made using a co-extrusion or a lamination method. Exemplary methods include, but are not limited to, thermal lamination, extrusion lamination and adhesive lamination. The preferred methods are co-extrusion and extrusion lamination.

In one embodiment the invention is a PV module comprising a polyolefin backsheet as described in any of the above embodiments.

BRIEF DESCRIPTION OF THE DRAWINGS

FIG. 1 is a schematic of a PV module.

DETAILED DESCRIPTION OF THE INVENTION

Definitions

Unless stated to the contrary, implicit from the context, or customary in the art, all parts and percents are based on weight and all test methods are current as of the filing date of this disclosure. For purposes of United States patent practice, the contents of any referenced patent, patent application or publication are incorporated by reference in their entirety (or its equivalent US version is so incorporated by reference) especially with respect to the disclosure of definitions (to the extent not inconsistent with any definitions specifically provided in this disclosure) and general knowledge in the art.

The numerical ranges in this disclosure are approximate, and thus may include values outside of the range unless otherwise indicated. Numerical ranges include all values from and including the lower and the upper values, in increments of one unit, provided that there is a separation of at least two units between any lower value and any higher value. As an example, if a compositional, physical or other property, such as, for example, molecular weight, viscosity, melt index, etc., is from 100 to 1,000, it is intended that all individual values, such as 100, 101, 102, etc., and sub ranges, such as 100 to 144, 155 to 170, 197 to 200, etc., are expressly enumerated. For ranges containing values which are less than one or containing fractional numbers greater than one (e.g., 1.1, 1.5, etc.), one unit is considered to be 0.0001, 0.001, 0.01 or 0.1, as appropriate. For ranges containing single digit numbers less than ten (e.g., 1 to 5), one unit is typically considered to be 0.1. These are only examples of what is specifically intended, and all possible combinations of numerical values between the lowest value and the highest value enumerated, are to be considered to be expressly stated in this disclosure. Numerical ranges are provided within this disclosure for, among other things, the amount of organoclay in the PV backsheet and/or encapsulant.

"Photovoltaic cells", "PV cells" and like terms mean a structure that contains one or more photovoltaic effect materials of any of several inorganic or organic types which are known in the art and from prior art photovoltaic module teachings. For example, commonly used photovoltaic effect materials include one or more of the known photovoltaic effect materials including but not limited to crystalline silicon, polycrystalline silicon, amorphous silicon, copper indium gallium (di)selenide (CIGS), copper indium selenide (CIS), cadmium telluride, gallium arsenide, dye-sensitized materials, and organic solar cell materials. As shown in FIG. 1, PV cells are typically employed in a laminate structure and have at least one light-reactive surface that converts the incident light into electric current. Photovoltaic cells are well known to practitioners in this field and are generally packaged into photovoltaic modules that protect the cell(s) and permit their usage in their various application environments, typically in outdoor applications. PV cells may be flexible or rigid in nature and include the photovoltaic effect materials and any protective coating surface materials that are applied in their production as well as appropriate wiring and electronic driving circuitry.

"Photovoltaic modules", "PV modules" and like terms mean a structure including a PV cell. In one embodiment the PV module 10 is represented by the example structure shown in FIG. 1, and it contains at least one photovoltaic cell 11 (in this case having a single light-reactive or effective surface directed or facing upward in the direction of the top of the page) surrounded or encapsulated by a light transmitting protective encapsulating sub-component 12a on the top or front surface and protective encapsulating sub-component 12b on the rear or back surface, which is optionally light transmitting. Combined, 12a and 12b form an encapsulating component 12, shown here as a combination of two encapsulating layers "sandwiching" the cell. The light transmitting cover sheet 13 has an interior surface in adhering contact with a front facial surface of encapsulating film layer 12a, which layer 12a is, in turn, disposed over and in adhering contact with PV cell 11. Backsheet film 14 (which can be single layered or, as shown here, multi-layered acts as a substrate and supports a rear surface of the PV cell 11 and optional encapsulating film layer 12b, which, in this case is disposed on a rear surface of PV cell 11. Back sheet layer 14 (and even encapsulating sub-layer 12b) need not be light transmitting if the surface of the PV cell to which it is opposed is not effective, i.e., reactive to sunlight. In the case of a flexible PV module, as the description "flexible" implies, it would comprise a flexible thin film photovoltaic cell 11.

"Composition" and like terms mean a mixture of two or more materials, such as a polymer which is blended with other polymers or which contains additives, fillers, or the like. Included in compositions are pre-reaction, reaction and post-reaction mixtures the latter of which will include reaction products and by-products as well as unreacted components of the reaction mixture and decomposition products, if any, formed from the one or more components of the pre-reaction or reaction mixture.

"Blend", "polymer blend" and like terms mean a composition of two or more polymers. Such a blend may or may not be miscible. Such a blend may or may not be phase separated. Such a blend may or may not contain one or more domain configurations, as determined from transmission electron spectroscopy, light scattering, x-ray scattering, and any other method known in the art. Blends are not laminates, but one or more layers of a laminate may contain a blend.

"Polymer" means a compound prepared by polymerizing monomers, whether of the same or a different type. The generic term polymer thus embraces the term homopolymer, usually employed to refer to polymers prepared from only one type of monomer, and the term interpolymer as defined below. It also embraces all forms of interpolymers, e.g., random, block, etc. The terms "ethylene/α-olefin polymer" and "propylene/α-olefin polymer" are indicative of interpolymers as described below. It is noted that although a polymer is often referred to as being "made of" monomers, "based on" a specified monomer or monomer type, "containing" a specified monomer content, or the like, this is obviously understood to be referring to the polymerized remnant of the specified monomer and not to the unpolymerized species.

"Interpolymer" means a polymer prepared by the polymerization of at least two different monomers. This generic term includes copolymers, usually employed to refer to polymers prepared from two or more different monomers, and includes polymers prepared from more than two different monomers, e.g., terpolymers, tetrapolymers, etc.

"Polyolefin", "polyolefin polymer", "polyolefin resin" and like terms mean a polymer produced from a simple olefin (also called an alkene with the general formula $C_nH_{2n}$) as a monomer. Polyethylene is produced by polymerizing ethylene with or without one or more comonomers, polypropylene by polymerizing propylene with or without one or more comonomers, etc. Thus, polyolefins include interpolymers such as ethylene/α-olefin copolymers, propylene/α-olefin copolymers, etc.

"(Meth)" indicates that the methyl substituted compound is included in the term. For example, the term "ethyleneglycidyl (meth)acrylate" includes ethylene-glycidyl acrylate (E-GA) and ethylene-glycidyl methacrylate (E-GMA), individually and collectively.

"Melting Point" as used here is typically measured by the differential scanning calorimetry (DSC) technique for measuring the melting peaks of polyolefins as described in U.S. Pat. No. 5,783,638. Many blends comprising two or more polyolefins will have more than one melting peak; many individual polyolefins will comprise only one melting peak.

PV Module

The invention is described in the context of a PV module as illustrated in FIG. 1 with the understanding that the PV module construction and materials of construction can vary widely, e.g., the backsheet can be mono- or multilayered, the polymers of the encapsulant and backsheet constructions can vary, the materials and construction of the PV cell can vary, etc. Central to the invention is the ability of the organoclay to capture impurities in the polymers that, if left uncaptured, can lead to leakage current and a resulting loss of PV cell efficiency. This is particularly true with PV module components made with polymers containing catalyst residue that can subsequently migrate, typically in an ionic form, throughout the structure.

Layer C of the Backsheet

In one embodiment, the polyolefin resins useful in the bottom layer or Layer C of the backsheet have a melting point of at least 125° C., preferably greater than 140° C., more preferably greater than 150° C. and even more preferably greater than 160° C. These polyolefin resins are preferably propylene-based polymers, commonly referred to as polypropylenes. These polyolefins are preferably made with multi-site catalysts, e.g., Zeigler-Natta and Phillips catalysts. In general, polyolefin resins with a melting point of at least 125° C. often exhibit desirable toughness properties useful in the protection of the electronic device of the module.

Regarding polyolefin resins in general, such as suitable for Layer C or for other polymer components of the present invention, the sole monomer (or the primary monomer in the case of interpolymers) is typically selected from ethylene, propene (propylene), 1-butene, 4-methyl-1-pentene, 1-hexene, 1-octene, 1-decene, 1-dodecene, 1-tetradecene, 1-hexadecene, and 1-octadecene and is preferably propylyene for the Layer C polyolefin resin. If the polyolefin resin is an interpolymer, then the comonomer(s) different from the first or primary monomer is/are typically one or more α-olefins. For purposes of this invention, ethylene is an α-olefin if propylene or higher olefin is the primary monomer. The co-α-olefin is then preferably a different $C_{2-20}$ linear, branched or cyclic α-olefin. Examples of $C_{2-20}$ α-olefins for use as comonomers include ethylene, propene (propylene), 1-butene, 4-methyl-1-pentene, 1-hexene, 1-octene, 1-decene, 1-dodecene, 1-tetradecene, 1-hexadecene, and 1-octadecene. The α-olefins for use as comonomers can also contain a cyclic structure such as cyclohexane or cyclopentane, resulting in an α-olefin such as 3-cyclohexyl-1-propene (allyl cyclohexane) and vinyl cyclohexane. Although not α-olefins in the classical sense of the term, for purposes of this invention certain cyclic olefins, such as norbornene and related olefins, are α-olefins and can be used as comonomer in place of some or all of the α-olefins described above. Similarly, styrene and its related olefins (for example, α-methylstyrene, etc.) are α-olefins for purposes of comonomers according to this invention. Acrylic and methacrylic acid and their respective ionomers, and acrylates and methacrylates are also comonomer α-olefins for purposes of this invention. Illustrative polyolefin copolymers include but are not limited to ethylene/propylene, ethylene/butene, ethylene/1-hexene, ethylene/1-octene, ethylene/styrene, ethylene/acrylic acid (EAA), ethylene/methacrylic acid (EMA), ethylene/acrylate or methacrylate, EVA and the like. Illustrative terpolymers include ethylene/propylene/1-octene, ethylene/propylene/butene, ethylene/butene/1-octene, and ethylene/butene/styrene. The copolymers can be random or blocky.

High melting point polyolefin resins (having a melting point of at least 125° C.), that are useful in the present invention and preferred for use as all or most of bottom Layer C of the multilayer backsheet of FIG. 1 include propylene-based polymers, also referred to as propylene polymers or polypropylenes, including e.g., polypropylene or propylene copolymers comprising a majority of units derived from propylene and a minority of units derived from another α-olefin (including ethylene). These propylene-based polymers include polypropylene homopolymer, copolymers of propylene and one or more other olefin monomers, a blend of two or more homopolymers or two or more copolymers, and a blend of one or more homopolymer with one or more copolymer, as long as it has a melting point of 125° C. or more. The polypropylene-based polymers can vary widely in form and include, for example, substantially isotactic propylene homopolymer, random propylene copolymers, and graft or block propylene copolymers.

The propylene copolymers preferably comprise at least 85, more preferably at least 87 and even more preferably at least 90, mole percent units derived from propylene. The remainder of the units in the propylene copolymer is derived from units of at least one α-olefin having up to about 20, preferably up to 12 and more preferably up to 8, carbon atoms. The α-olefin is preferably a $C_{3-20}$ linear, branched or cyclic α-olefin as described above.

In general, preferred propylene polymer resins include homopolymer polypropylenes, preferably high crystallinity polypropylene such as high stiffness and toughness polypropylenes. Preferably the propylene polymer MFR (measured in dg/min at 230° C./2.16 kg) is at least about 0.5, preferably at least about 1.5, and more preferably at least about 2.5 dg/min and less than or equal to about 25, preferably less than or equal to about 20, and most preferably less than or equal to about 18 dg/min.

In general, preferred propylene polymer resins for Layer C have heat of fusion values (reflecting the relatively higher crystallinity) as measured by DSC of at least about 60 Joules per gram (J/g), more preferably at least about 90 J/g, still more preferably at least about 110 J/g and most preferably at least about 120 J/g. For the heat of fusion measurements, as generally known and performed by practitioners in this area, the DSC is run as generally described below under nitrogen at 10° C./min from 23° C. to 220° C., held isothermal at 220° C. for 3 minutes, dropped to 23° C. at 10° C./min and ramped back to 220° C. at 10° C./min. The second heat data is used to calculate the heat of fusion of the melting transition.

The following are illustrative but non-limiting propylene polymers that can be used in the backsheets of this invention: a propylene impact copolymer including but not limited to DOW Polypropylene T702-12N; a propylene homopolymer including but not limited to DOW Polypropylene H502-25RZ; and a propylene random copolymer including but not limited to DOW Polypropylene R751-12N. Other polypropylenes include some of the VERSIFY™ polymers available from The Dow Chemical Company, the VISTAMAXX™ polymers available from ExxonMobil Chemical Company, and the PRO-FAX™ polymers available from Lyondell Basell Industries, e.g., PRO-FAX™ SR-256M, which is a clarified propylene copolymer resin with a density of 0.90 g/cc and a MFR of 2 g/10 min, PRO-FAX™ 8623, which is an impact propylene copolymer resin with a density of 0.90 g/cc and a 1MFR of 1.5 g/10 min. Still other propylene resins include CATALLOY™ in-reactor blends of polypropylene (homo- or copolymer) with one or more of propylene-ethylene or ethylene-propylene copolymer (all available from Basell, Elkton, MD), Shell's KF 6100 propylene homopolymer; Solvay's KS 4005 propylene copolymer; and Solvay's KS 300 propylene terpolymer. Furthermore, INSPIRE™ D114, which is a branched impact copolymer polypropylene with a melt flow rate (MFR) of 0.5 dg/min (230° C./2.16 kg) and a melting point of 164° C. would be a suitable polypropylene. In general, suitable high crystallinity polypropylene with high stiffness and toughness include but are not limited to INSPIRE™ 404 with an MFR of 3 dg/min, and INSPIRE™ D118.01 with a melt flow rate of 8.0 dg/min (230° C./2.16 kg), (both also available from The Dow Chemical Company).

Propylene polymer blend resins can also be used where polypropylene resins as described above can be blended or diluted with one or more other polymers, including polyolefins as described below, to the extent that the other polymer is (i) miscible or compatible with the polypropylene, (ii) has little, if any, deleterious impact on the desirable properties of the polypropylene, e.g., toughness and modulus, and (iii) the polypropylene constitutes at least about 55, preferably at least about 60, more preferably at least about 65 and still more preferably at least about 70, weight percent of the blend. The polypropylene polymer can be also be blended with cyclic olefin copolymers such as TOPAS™ 6013F-04 cyclic olefin copolymer available from Topas Advanced Polymers, Inc. with preferred amounts when used at least about 2, preferably 4, and more preferably 8 weight percent up to and including to 40, preferably 35 and more preferably 30 weight percent. In general, propylene polymer resins for Layer C can comprise an impact modifier such as ethylene octene plastomers such as AFFINITY™ PL 1880G, EG 8100G, and PL 1850G available from The Dow Chemical Company. In general, these are used in amounts at least of about 2 weight percent, preferably at least about 5 and more preferably at least about 8 weight percent and preferably less than about 45 weight %, preferably less than about 35 weight percent and more preferably less than about 30 weight percent. Other candidate impact modification or blend resins are ethylene/propylene rubbers (optionally blended with polypropylene in-reactor) and one or more block composites as described herein. Combinations of impact modifiers of different types may also be used.

Other additives that could be used with the propylene polymer resins are inorganic fillers such as talc (including epoxy coated talc), colorants, flame retardants (halogenated and non-halogenated) and flame retardant synergists such as $Sb_2O_3$.

Layer B of the Backsheet

The composition of Layer B of the backsheet of one embodiment of the invention, often referred to as a "tie" layer, is selected to be adhered, either preferably by co-extrusion or alternatively but less preferably by a lamination process (such as extrusion lamination, thermal lamination, or adhesive lamination) to the layers C and A (or optionally another layer). Layer B typically comprises a Crystalline Block Copolymer Composite Resin ("CBC") and/or certain Block copolymer Composite Resins ("BC's"), CBC's and BC's collectively referred to herein as "Crystalline Block and Block Composite Resins" "Composite Resins" or "(C) BC's". Layer B can alternatively comprise a blend of one or more CBC and with one or more BC, or a blend of one or both of these resins with one or more other resin.

The term "block copolymer" or "segmented copolymer" refers to a polymer comprising two or more chemically distinct regions or segments (referred to as "blocks") joined in a linear manner, that is, a polymer comprising chemically differentiated units which are joined (covalently bonded) end-to-end with respect to polymerized functionality, rather than in pendent or grafted fashion. In a preferred embodiment, the blocks differ in the amount or type of comonomer incorporated therein, the density, the amount of crystallinity, the type of crystallinity (e.g. polyethylene versus polypropylene), the crystallite size attributable to a polymer of such composition, the type or degree of tacticity (isotactic or syndiotactic), regio-regularity or regio-irregularity, the amount of branching, including long chain branching or hyper-branching, the homogeneity, or any other chemical or physical property. The block copolymers of the invention are characterized by unique distributions of both polymer polydispersity (PDI or Mw/Mn) and block length distribution, due, in a preferred embodiment, to the effect of a shuttling agent(s) in combination with the catalyst(s).

As used herein, the terms "block composite" or "block copolymer composite" resins are different from "crystalline block composites" or "crystalline block copolymer composite resins" based on the amount of comonomer polymerized with the ethylene polymer and ethylene block in the composite. The term "BC" refers generally to polymers comprising (i) a soft ethylene copolymer (EP) having polymerized units in which the comonomer content is greater than 10 mol % and less than 90 mol % polymerized ethylene, and preferably greater than 20 mol % and less than 80 mol %, and most preferably greater than 33 mol % and less than 75 mol %, (ii) a hard or crystalline α-olefin polymer (CAOP), in which the α-olefin monomer is present in an amount of from greater than 90 up to 100 mol percent, and preferably greater than 93 mol percent, and more preferably greater than 95 mol percent, and most preferably greater than 98 mol percent and (iii) a block copolymer, preferably a diblock, having a soft segment and a hard segment, wherein the hard segment of the block copolymer is essentially the same composition as the hard α-olefin polymer in the block composite and the soft segment of the block copolymer is essentially the same composition as the soft ethylene copolymer of the block composite. The block copolymers can be linear or branched. More specifically, when produced in a continuous process, the block composites desirably possess PDI from 1.7 to 15, preferably from 1.8 to 3.5, more preferably from 1.8 to 2.2, and most preferably from 1.8 to 2.1. When produced in a batch or semi-batch process, the block composites desirably possess PDI from 1.0 to 2.9, preferably from 1.3 to 2.5, more preferably from 1.4 to 2.0, and most preferably from 1.4 to 1.8. Such block composites are described in, for example, US Patent Application Publication Nos. US2011-0082257, US2011-0082258 and US2011-0082249, all published on Apr. 7, 2011 and incorporated herein by reference with respect to descriptions of the block composites, processes to make them and methods of analyzing them.

As mentioned above, alternatively or in addition to the CBC (discussed in more detail below), certain suitable "BC" resins can be employed in Layer B in the films according to the present invention. The specific suitable "BC's" comprise a soft ethylene copolymer (EP) having the comonomer content greater than 80 mol % and up to 90 mol % and preferably greater than 85 mol % and most preferably greater than 87 mol %, but otherwise a BC as generally described herein.

The term "crystalline block composite" (CBC) (including the term "crystalline block copolymer composite") refers to polymers comprising a crystalline ethylene based polymer (CEP), a crystalline alpha-olefin based polymer (CAOP), and a block copolymer having a crystalline ethylene block (CEB) and a crystalline alpha-olefin block (CAOB), wherein the CEB of the block copolymer is essentially the same composition as the CEP in the block composite and the CAOB of the block copolymer is essentially the same composition as the CAOP of the block composite. Additionally, the compositional split between the amount of CEP and CAOP will be essentially the same as that between the corresponding blocks in the block copolymer. The block copolymers can be linear or branched. More specifically, each of the respective block segments can contain long chain branches, but the block copolymer segment is substantially linear as opposed to containing grafted or branched blocks. When produced in a continuous process, the crystalline block composites desirably possess PDI from 1.7 to 15, preferably 1.8 to 10, preferably from 1.8 to 5, more preferably from 1.8 to 3.5. Such crystalline block composites are described in, for example, the following filed patent applications: PCT/US11/41189; U.S. Ser. No. 13/165,054; PCT/US11/41191; U.S. Ser. No. 13/165,073; PCT/US11/41194; and U.S. Ser. No. 13/165,096; all filed on 21 Jun. 2011.

CAOB refers to highly crystalline blocks of polymerized alpha olefin units in which the monomer is present in an amount greater than 90 mol %, preferably greater than 93 mol percent, more preferably greater than 95 mol percent, and preferably greater than 96 mol percent. In other words, the comonomer content in the CAOBs is less than 10 mol percent, and preferably less than 7 mol percent, and more preferably less than 5 mol percent, and most preferably less than 4 mol %. CAOBs with propylene crystallinity have corresponding melting points that are 80° C. and above, preferably 100° C. and above, more preferably 115° C. and above, and most preferably 120° C. and above. In some embodiments, the CAOB comprise all or substantially all propylene units. CEB, on the other hand, refers to blocks of polymerized ethylene units in which the comonomer content is 10 mol % or less, preferably between 0 mol % and 10 mol %, more preferably between 0 mol % and 7 mol % and most preferably between 0 mol % and 5 mol %. Such CEB have corresponding melting points that are preferably 75° C. and above, more preferably 90° C., and 100° C. and above.

"Hard" segments refer to highly crystalline blocks of polymerized units in which the monomer is present in an amount greater than 90 mol percent, and preferably greater than 93 mol percent, and more preferably greater than 95 mol percent, and most preferably greater than 98 mol percent. In other words, the comonomer content in the hard segments is most preferably less than 2 mol percent, and more preferably less than 5 mol percent, and preferably less than 7 mol percent, and less than 10 mol percent. In some embodiments, the hard segments comprise all or substantially all propylene units. "Soft" segments, on the other hand, refer to amorphous, substantially amorphous or elastomeric blocks of polymerized units in which the comonomer content is greater than 10 mol % and less than 90 mol % and preferably greater than 20 mol % and less than 80 mol %, and most preferably greater than 33 mol % and less than 75 mol %.

The BC's and/or CBC's are preferably prepared by a process comprising contacting an addition polymerizable monomer or mixture of monomers under addition polymerization conditions with a composition comprising at least one addition polymerization catalyst, a co-catalyst and a chain shuttling agent, said process being characterized by formation of at least some of the growing polymer chains under differentiated process conditions in two or more reactors operating under steady state polymerization conditions or in two or more zones of a reactor operating under plug flow polymerization conditions. In a preferred embodiment, the BC's and/or CBC's comprise a fraction of block polymer which possesses a most probable distribution of block lengths.

Suitable processes useful in producing the block composites and crystalline block composites may be found, for example, in US. 2008/0269412.

Suitable catalysts and catalyst precursors for use in preparing BC's and/or CBC's invention include metal complexes such as disclosed in WO2005/090426, in particular, those disclosed starting on page 20, line 30 through page 53, line 20, which is herein incorporated by reference. Suitable catalysts are also disclosed in US 2006/0199930; US 2007/0167578; US 2008/0311812; U.S. Pat. No. 7,355,089 B2; or WO 2009/012215, which are herein incorporated by reference with respect to catalysts.

Preferably, the BC's and/or CBC's comprise propylene, 1-butene or 4-methyl-1-pentene and one or more comonomers. Preferably, the block polymers of the BC's and CBC's comprise in polymerized form propylene and ethylene and/or one or more $C_{4-20}$ α-olefin comonomers, and/or one or more additional copolymerizable comonomers or they comprise 4-methyl-1-pentene and ethylene and/or one or more $C_{4-20}$ α-olefin comonomers, or they comprise 1-butene and ethylene, propylene and/or one or more $C_5$-$C_{20}$ α-olefin comonomers and/or one or more additional copolymerizable comonomers. Additional suitable comonomers are selected from diolefins, cyclic olefins, and cyclic diolefins, halogenated vinyl compounds, and vinylidene aromatic compounds.

Comonomer content in the resulting BC's and/or CBC's may be measured using any suitable technique, with techniques based on nuclear magnetic resonance (NMR) spectroscopy preferred. It is highly desirable that some or all of the polymer blocks comprise amorphous or relatively amorphous polymers such as copolymers of propylene, 1-butene or 4-methyl-1-pentene and a comonomer, especially random copolymers of propylene, 1-butene or 4-methyl-1-pentene with ethylene, and any remaining polymer blocks (hard segments), if any, predominantly comprise propylene, 1-butene or 4-methyl-1-pentene in polymerized form. Preferably such segments are highly crystalline or stereospecific polypropylene, polybutene or poly-4-methyl-1-pentene, especially isotactic homopolymers.

Further preferably, the block copolymers of the BC's and/or CBC's comprise from 10 to 90 weight percent crystalline or relatively hard segments and 90 to 10 weight percent amorphous or relatively amorphous segments (soft segments), preferably from 20 to 80 weight percent crystalline or relatively hard segments and 80 to 20 weight percent amorphous or relatively amorphous segments (soft segments), most preferably from 30 to 70 weight percent crystalline or relatively hard segments and 70 to 30 weight percent amorphous or relatively amorphous segments (soft segments). Within the soft segments, the mole percent comonomer may range from 10 to 90 mole percent, preferably from 20 to 80 mole percent, and most preferably from 33 to 75 mol % percent. In the case wherein the comonomer is ethylene, it is preferably present in an amount of 10 mol % to 90 mol %, more preferably from 20 mol % to 80 mol %, and most preferably from 33 mol % to 75 mol % percent. Preferably, the copolymers comprise hard segments that are 90 mol % to 100 mol % propylene. The hard segments can be greater than 90 mol % preferably greater than 93 mol % and more preferably greater than 95 mol % propylene, and most preferably greater than 98 mol % propylene. Such hard segments have corresponding melting points that are 80° C. and above, preferably 100° C. and above, more preferably 115° C. and above, and most preferably 120° C. and above.

In some embodiments, the block copolymer composites of the invention have a Block Composite Index (BCI), as defined below, that is greater than zero but less than about 0.4 or from about 0.1 to about 0.3. In other embodiments, BCI is greater than about 0.4 and up to about 1.0. Additionally, the BCI can be in the range of from about 0.4 to about 0.7, from about 0.5 to about 0.7, or from about 0.6 to about 0.9. In some embodiments, BCI is in the range of from about 0.3 to about 0.9, from about 0.3 to about 0.8, or from about 0.3 to about 0.7, from about 0.3 to about 0.6, from about 0.3 to about 0.5, or from about 0.3 to about 0.4. In other embodiments, BCI is in the range of from about 0.4 to about 1.0, from about 0.5 to about 1.0, or from about 0.6 to about 1.0, from about 0.7 to about 1.0, from about 0.8 to about 1.0, or from about 0.9 to about 1.0.

The block composites preferably have a Tm greater than 100° C., preferably greater than 120° C., and more preferably greater than 125° C. Preferably the MFR of the block composite is from 0.1 to 1000 dg/min, more preferably from 0.1 to 50 dg/min and more preferably from 0.1 to 30 dg/min.

Further preferably, the block composites of this embodiment of the invention have a weight average molecular weight (Mw) from 10,000 to about 2,500,000, preferably from 35000 to about 1,000,000 and more preferably from 50,000 to about 300,000, preferably from 50,000 to about 200,000.

Preferably, the block composite polymers of the invention comprise ethylene, propylene, 1-butene or 4-methyl-1-pentene and optionally one or more comonomers in polymerized form. Preferably, the block copolymers of the crystalline block composites comprise in polymerized form ethylene, propylene, 1-butene, or 4-methyl-1-pentene and optionally one or more $C_{4-20}$ α-olefin comonomers. Additional suitable comonomers are selected from diolefins, cyclic olefins, and cyclic diolefins, halogenated vinyl compounds, and vinylidene aromatic compounds.

Comonomer content in the resulting block composite polymers may be measured using any suitable technique, with techniques based on nuclear magnetic resonance (NMR) spectroscopy preferred.

Preferably the crystalline block composite polymers of the invention comprise from 0.5 to 95 wt % CEP, from 0.5 to 95 wt % CAOP and from 5 to 99 wt % block copolymer. More preferably, the crystalline block composite polymers comprise from 0.5 to 79 wt % CEP, from 0.5 to 79 wt % CAOP and from 20 to 99 wt % block copolymer and more preferably from 0.5 to 49 wt % CEP, from 0.5 to 49 wt % CAOP and from 50 to 99 wt % block copolymer. Weight percents are based on total weight of crystalline block composite. The sum of the weight percents of CEP, CAOP and block copolymer equals 100%.

Preferably, the block copolymers of the invention comprise from 5 to 95 weight percent crystalline ethylene blocks (CEB) and 95 to 5 wt percent crystalline alpha-olefin blocks (CAOB). They may comprise 10 wt % to 90 wt % CEB and 90 wt % to 10 wt % CAOB. More preferably, the block copolymers comprise 25 to 75 wt % CEB and 75 to 25 wt % CAOB, and even more preferably they comprise 30 to 70 wt % CEB and 70 to 30 wt % CAOB.

In some embodiments, the block composites of the invention have a Crystalline Block Composite Index (CBCI), as defined below, that is greater than zero but less than about 0.4 or from about 0.1 to about 0.3. In other embodiments, CBCI is greater than about 0.4 and up to about 1.0. In some embodiments, the CBCI is in the range of from about 0.1 to about 0.9, from about 0.1 to about 0.8, from about 0.1 to about 0.7 or from about 0.1 to about 0.6. Additionally, the CBCI can be in the range of from about 0.4 to about 0.7, from about 0.5 to about 0.7, or from about 0.6 to about 0.9. In some embodiments, CBCI is in the range of from about 0.3 to about 0.9, from about 0.3 to about 0.8, or from about 0.3 to about 0.7, from about 0.3 to about 0.6, from about 0.3 to about 0.5, or from about 0.3 to about 0.4. In other embodiments, CBCI is in the range of from about 0.4 to about 1.0, from about 0.5 to about 1.0, or from about 0.6 to about 1.0, from about 0.7 to about 1.0, from about 0.8 to about 1.0, or from about 0.9 to about 1.0.

Further preferably, the crystalline block composites of this embodiment of the invention have a weight average molecular weight (Mw) of 1,000 to about 2,500,000, preferably of 35000 to about 1,000,000 and more preferably of 50,000 to 500,000, of 50,000 to about 300,000, and preferably from 50,000 to about 200,000.

The overall composition of each resin is determined by DSC, NMR, GPC, DMS, and TEM morphology. Xylene fractionation and HTLC fractionation can be further used to estimate the yield of block copolymer, and in particular the block composite index. These are described in more detail in US Patent Application Publication Nos US2011-0082257, US2011-0082258 and US2011-0082249.

Differential Scanning calorimetry is used to measure, among other things, the heats of fusion of the crystalline block and block composites and is performed on a TA Instruments Q1000 DSC equipped with an RCS cooling accessory and an auto sampler. A nitrogen purge gas flow of 50 ml/min is used. The sample is pressed into a thin film and melted in the press at about 190° C. and then air-cooled to room temperature (25° C.). About 3-10 mg of material is then cut, accurately weighed, and placed in a light aluminum pan (ca 50 mg) which is later crimped shut. The thermal behavior of the sample is investigated with the following temperature profile: the sample is rapidly heated to 190° C. and held isothermal for 3 minutes in order to remove any previous thermal history. The sample is then cooled to −90° C. at 10° C./min cooling rate and held at −90° C. for 3 minutes. The sample is then heated to 190° C. at 10° C./min heating rate. The cooling and second heating curves are recorded. For the heat of fusion measurements for the CBC and specified BC resins, as known and routinely performed by skilled practitioners in this area, the baseline for the calculation is drawn from the flat initial section prior to the onset of melting (typically in the range of from about −10 to about 20° C. for these types of materials) and extends to the end of melting for the second heating curve.

To summarize:
Suitable block composite resins (BC's) comprise:
   i) An ethylene polymer (EP) comprising from about 80 to about 90 mol % polymerized ethylene, preferably at least about 85 mol %;
   ii) An alpha-olefin-based crystalline polymer (CAOP); and
   iii) a block copolymer comprising (a) an ethylene polymer block (EB) comprising from about 80 to about 90 mol % ethylene and (b) a crystalline alpha-olefin block (CAOB).

Crystalline block composite resins (CBC's) comprise:
   i) a crystalline ethylene polymer (CEP) comprising at least greater than about 90 mol % polymerized ethylene, preferably at least about 93 mol %;
   ii) an alpha-olefin-based crystalline polymer (CAOP); and
   iii) a block copolymer comprising (a) a crystalline ethylene polymer block (CEB) comprising at least greater than about 90 mol % polymerized ethylene, preferably at least about 93 mol % and (b) a crystalline alpha-olefin block (CAOB).

Another way to collectively summarize the suitable resin(s) used in Layer B is as comprising a CBC or a specified BC comprising:
   i) an ethylene polymer comprising at least about 80 mol % polymerized ethylene, preferably at least about 85 mol %, more preferably at least about 90 mol %, and most preferably at least about 93 mol % polymerized ethylene;
   ii) an alpha-olefin-based crystalline polymer (CAOP); and
   iii) a block copolymer comprising (a) an ethylene polymer block comprising at least about 80 mol % polymerized ethylene, preferably at least about 85 mol %, more preferably at least about 90 mol %, and most preferably at least about 93 mol % polymerized ethylene and (b) a crystalline alpha-olefin block (CAOB).

Preferred suitable BC and/or CBC resin(s) for Layer B have a CAOB amount (in part (iii)) in the range of from about 30 to about 70 weight % (based on (iii)), preferably at least about 40 wt %, more preferably at least about 45 wt % and most preferably about 50 wt %, and preferably up to about 60 wt %, and preferably up to about 55 wt % (the balance in each case being ethylene polymer). It has also been found that the BC and/or CBC resin(s) suitable for Layer B have a (crystalline) block composite index of at least about 0.1, preferably at least about 0.3, preferably at least about 0.5 and more preferably at least about 0.7. Another way to characterize the suitable BC and/or CBC resin(s) essential for Layer B is as having a MFR in the range of from about 1 to about 50 dg/min; preferably at least about 2, more preferably at least about 3; and preferably up to about 40, and preferably up to about 30 g/min.

In general, BC's that can be used in Layer B according to the present invention will have heat of fusion values (generally related to their ethylene content in the EP and EB) of at least about 75 Joules per gram (J/g), more preferably at least about 80 J/g, still more preferably at least about 85 J/g and most preferably at least about 90 J/g, as measured by DSC. In general, CBC's that can be used in Layer B according to the present invention will have heat of fusion values (reflecting the relatively higher ethylene content in the CEP and CEB) as measured by DSC of at least about 85 Joules per gram (J/g), more preferably at least about 90 J/g. In either case, the heat of fusion values for polymers of these types would generally have a maximum in the area of about 125 J/g. For the heat of fusion measurements, as generally known and performed by practitioners in this area, the DSC is run as generally described below under nitrogen at 10° C./min from 23° C. to 220° C., held isothermal at 220° C., dropped to 23° C. at 10° C./min and ramped back to 220° C. at 10° C./min. The second heat data is used to calculate the heat of fusion of the melting transition.

Blends of these resins can also be used where blended or diluted with one or more other polymers, including polyolefins as described herein, to the extent that (i) the other polymer is miscible or highly compatible with the BC and/or CBC, (ii) the other polymer has little, if any, deleterious impact on the desirable properties of the polyolefin block copolymer composite, e.g., toughness and modulus, and (iii) the BC and/or CBC resin(s) constitute from at least about 40 to 99 weight percent of the blend, preferably at least about 60, more preferably at least about 75, and more preferably at least about 80 weight percent of the blend. Blending can be used to provide: improve compatibility (adhesion) with C and/or other layers under a range of conditions and lower costs. In particular, blends would desirably be employed where Layer B is employed as surface layer, as discussed below, and this film surface needs properties sufficient for roll-up, handling, packaging, transport and assembly into final laminate structures, such as into electronic device modules.

Layer A of the Backsheet

Layer A according to the present invention, often referred to as a "seal" layer, is selected to be adhered, either preferably by co-extrusion or alternatively but less preferably by a lamination process (such as extrusion lamination, thermal lamination, or adhesive lamination) to the tie layer (Layer B) in production of the film according to the invention and to adhere the film to other films or articles such as the encapsulation films employed in the assembly of electronic devices ("encapsulation films" being discussed in more detail below). Layer A materials can be selected from a very wide variety of different types of materials assembled in blends and/or layers as described in more detail below. Among other things, the relative thinness of Layer A distinguishes it from a layer that would serve as an "encapsulation" layer.

The wide variety of candidate seal layer materials includes generally wide range of thermoplastic ethylene-based polymers, such as high pressure, free-radical low density polyethylene (LDPE), and ethylene-based polymers prepared with Ziegler-Natta catalysts, including high density polyethylene (HDPE) and heterogeneous linear low density polyethylene (LLDPE), ultra low density polyethylene (ULDPE), and very low density polyethylene (VLDPE), as well as multiple-reactor ethylenic polymers ("in reactor" blends of Ziegler-Natta PE and metallocene PE, such as products disclosed in U.S. Pat. No. 6,545,088 (Kolthammer et al.); U.S. Pat. No. 6,538,070 (Cardwell et al.); U.S. Pat. No. 6,566,446 (Parikh et al.); U.S. Pat. No. 5,844,045 (Kolthammer et al.); U.S. Pat. No. 5,869,575 (Kolthammer et al.); and U.S. Pat. No. 6,448,341 (Kolthammer et al.)). Commercial examples of linear ethylene-based polymers include ATTANE™ Ultra Low Density Linear Polyethylene Copolymer, DOWLEX™ Polyethylene Resins, and FLEXOMER™ Very Low Density Polyethylene, all available from The Dow Chemical Company. Other suitable synthetic polymers include ethylene/diene interpolymers, ethylene acrylic acid (EAA), ethylene-vinyl acetate (EVA), ethylene ethyl acrylate (EEA), ethylene methyl acrylate (EMA), ethylene n-butyl acrylate (EnBA), ethylene methacrylic acid (EMAA), various types of ionomers, and ethylene/vinyl alcohol copolymers. Homogeneous olefin-based polymers such as ethylene-based plastomers or elastomers can also be useful as components in blends or compounds made with the ethylenic polymers of this invention. Commercial examples of homogeneous metallocene-catalyzed, ethylene-based plastomers or elastomers include AFFINITY™ polyolefin plastomers and ENGAGE™ polyolefin elastomers, both available from The Dow Chemical Company, and commercial examples of homogeneous propylene-based plastomers and elastomers include VERSIFY™ performance polymers, available from The Dow Chemical Company, and VISTAMAX™ polymers available from ExxonMobil Chemical Company.

Layer A Olefinic Interpolymers

Some specific preferred examples of olefinic interpolymers useful in this invention, particularly in the top layer of the backsheet, include very low density polyethylene (VLDPE) (e.g., FLEXOMER™ ethylene/1-hexene polyethylene made by The Dow Chemical Company), homogeneously branched, linear ethylene/α-olefin copolymers (e.g. TAFMER™ by Mitsui Petrochemicals Company Limited and EXACT™ by Exxon Chemical Company), homogeneously branched, substantially linear ethylene/α-olefin polymers (e.g., AFFINITY™ and ENGAGE™ polyethylene available from The Dow Chemical Company), and ethylene multi-block copolymers (e.g., INFUSE™ olefin block copolymers available from The Dow Chemical Company). The more preferred polyolefin copolymers for use in the top layer of the backsheet are the homogeneously branched linear and substantially linear ethylene copolymers, particularly the substantially linear ethylene copolymers which are more fully described in U.S. Pat. Nos. 5,272,236, 5,278,272 and 5,986,028, and the ethylene multi-block copolymers which are more fully described in U.S. Pat. No. 7,355,089, WO 2005/090427, US2006/0199931, US2006/0199930, US2006/0199914, US2006/0199912, US2006/0199911, US2006/0199910, US2006/0199908, US2006/0199906, US2006/0199905, US2006/0199897, US2006/0199896, US2006/0199887, US2006/0199884, US2006/0199872, US2006/0199744, US2006/0199030, US2006/0199006 and US2006/0199983.

Layer A Polar Ethylene Copolymers

One preferred polar ethylene copolymer for use in the top layer of the claimed films is an EVA copolymer, including blends comprising EVA copolymers, that will form a sealing relationship with other films or layers, e.g., encapsulant, a glass cover sheet, etc. when brought into adhesive contact with the layer or other component. The ratio of units derived from ethylene to units derived from vinyl acetate in the copolymer, before grafting or other modification, can vary widely, but typically the EVA copolymer contains at least about 1, preferably at least about 2, more preferably at least about 4 and even more preferably at least about 6, wt % units derived from vinyl acetate. Typically, the EVA copolymer contains less than about 33 wt % units derived from vinyl acetate, preferably less than about 30, preferably less than about 25, preferably less than about 22, preferably less than about 18 and more preferably less than about 15 wt % units derived from vinyl acetate. The EVA copolymer can be made by any process including emulsion, solution and high-pressure polymerization.

The EVA copolymer before grafting or other modification typically has a density of less than about 0.95, preferably less than about 0.945, more preferably less than about 0.94, g/cc. The same EVA copolymer typically has a density greater than about 0.9, preferably greater than 0.92, and more preferably greater than about 0.925, g/cc. Density is measured by the procedure of ASTM D-792. EVA copolymers are generally characterized as semi-crystalline, flexible and having good optical properties, e.g., high transmission of visible and UV-light and low haze.

Another preferred polar ethylene copolymer useful as top layer of the backsheet is an ethylene acrylate copolymer such as ethylene ethyl acrylate (EEA) and ethylene methyl acrylate (EMA) copolymers, (including blends comprising either) that can also form a sealing relationship with the adjacent layer, such as an encapsulant layer in an electronic device module, when they are brought into adhesive contact. The ratio of units derived from ethylene to units derived from ethyl acrylate or methyl acrylate in the copolymer, before grafting or other modification, can vary widely, but typically the EEA or EMA copolymer contains at least about 1, preferably at least about 2, more preferably at least about 4 and even more preferably at least about 6, wt % units derived from the ethyl acrylate or methyl acrylate. Typically, the EEA or EMA copolymer contains less than about 28, preferably less than about 25, more preferably less than 22, and more preferably less than about 19, wt % units derived from ethyl acrylate or methyl acrylateacrylate.

These polar ethylene copolymers (e.g., EVA, EEA or EMA copolymers) typically have a melt index (MI as measured by the procedure of ASTM D-1238 (190C/2.16 kg) of less than 100, preferably less than 75, more preferably less than 50 and even more preferably less than 30, g/10 min. The typical minimum MI is at least about 0.3, more preferably 0.7, and more preferably it is at least about 1 g/10 min.

One preferred top layer of the backsheet is a blend formulation of a linear low density polyethylene (LLDPE) comprising polar ethylene copolymer in an amount of from about 10 to about 45 weight %, the weight % depending upon the polar ethylene copolymer being used.

Layer A MAH-m-Polyolefins

MAH-m-polyolefins are another preferred seal layer material and include MAH-g-polyolefins and MAH interpolymers, i.e., the MAH functionality is present in the polyolefin either by grafting onto the polymer backbone or incorporating the functionality into the backbone through copolymerization of MAH with the olefin monomer.

In one embodiment of the invention, the polyolefin is graft-modified to enhance the interlayer adhesion between the top layer and the bottom layer of the multilayer structure through a reaction of the grafted functionality with the reactive group present in the middle tie layer. Any material that can be grafted to the polyolefin and can react with the reactive group present in the tie layer can be used as the graft material.

Any unsaturated organic compound containing at least one ethylenic unsaturation (e.g., at least one double bond), at least one carbonyl group (—C=O), and that will graft to the polyolefin polymer and more particularly to EVA, EEA, EMA or polypropylene, can be used as the grafting material. Representative of compounds that contain at least one carbonyl group are the carboxylic acids, anhydrides, esters and their salts, both metallic and nonmetallic. Preferably, the organic compound contains ethylenic unsaturation conjugated with a carbonyl group. Representative compounds include maleic, fumaric, acrylic, methacrylic, itaconic, crotonic, α-methyl crotonic, and cinnamic acid and their anhydride, ester and salt derivatives, if any. Maleic anhydride is the preferred unsaturated organic compound containing at least one ethylenic unsaturation and at least one carbonyl group.

The unsaturated organic compound content of the graft polyolefin is at least about 0.01 wt %, and preferably at least about 0.05 wt %, based on the combined weight of the polyolefin and the organic compound. The maximum amount of unsaturated organic compound content can vary to convenience, but typically it does not exceed about 10 wt %, preferably it does not exceed about 5 wt %, and more preferably it does not exceed about 2 wt %. This unsaturated organic content of the graft polyolefin is measured by a titration method, e.g., a grafted polyolefin/xylene solution is titrated with a potassium hydroxide (KOH) solution. The MAH functionality can be present in the polyolefin e.g., by grafting, or even by copolymerization with the olefin monomer.

The unsaturated organic compound can be grafted to the polyolefin by any known technique, such as those taught in U.S. Pat. Nos. 3,236,917 and 5,194,509. For example, in the '917 patent the polymer is introduced into a two-roll mixer and mixed at a temperature of 60° C. The unsaturated organic compound is then added along with a free radical initiator, such as, for example, benzoyl peroxide, and the components are mixed at 30° C. until the grafting is completed. In the '509 patent, the procedure is similar except that the reaction temperature is higher, e.g., 210 to 300° C., and a free radical initiator is not used or is used at a reduced concentration.

An alternative and preferred method of grafting is taught in U.S. Pat. No. 4,950,541 by using a twin-screw devolatilizing extruder as the mixing apparatus. The polymer and unsaturated organic compound are mixed and reacted within the extruder at temperatures at which the reactants are molten and in the presence of a free radical initiator. Preferably, the unsaturated organic compound is injected into a zone maintained under pressure within the extruder.

Layer A Silane Grafted Ethylene-Based Polymers

In another preferred embodiment, a suitable material for Layer A can be provided by a silane grafted polyolefin as described below for use as the encapsulation layer, particularly as provided by silane grafting in the thermoplastic ethylene-based polymers described above, including in an olefinic interpolymer or polar ethylene copolymer described above. If used as Layer A in a backsheet film according to the present invention, as discussed below, the silane grafted polyolefin layer thickness would generally be less than about 200 micron (μm), and more preferably less than 100 μm and not sufficient to serve as a typical encapsulation layer that is commonly a film about 450 μm thick. It will, however, in layer A of the present films provide good sealing with such materials used in encapsulation films.

Layer a Crystalline Olefin Block Composite

In another preferred embodiment of the present invention and depending upon the nature of the encapsulant film layer, a suitable sealing layer can be provided by a crystalline block copolymer composite as described above. In a backsheet according to the present invention, depending upon the specific selection of this type of crystalline block copolymer composite as the B layer, the B layer can serve as both Layers B and A. In a preferred embodiment, the present invention is a novel film comprising Layers B and C. In this embodiment, it may also be desirable to incorporate a minor amount (e.g., less than 25%) of a polar ethylene copolymer in such crystalline block copolymer composite.

Blends

Blends comprising these polyolefin resins with others as described above can also be used in Layer A of films according to the invention. In other words, Layer A polyolefin polymers can be blended or diluted with one or more other polymers to the extent that the polyolefin is (i) miscible with the other polymer, (ii) the other polymer has little, if any, deleterious impact on the desirable properties of the polyolefin polymer, e.g., toughness and modulus, and (iii) the polyolefin polymer of this invention constitutes at least about 55, preferably at least about 70, preferably at least about 75 and more preferably at least about 80, weight percent of the blend.

Crosslinking in Layers A or B

Although crosslinking would preferably be avoided, due to the low density and modulus of the polyolefin resins used in the practice of this invention, these polymers can be cured or crosslinked at the time of lamination or after, usually shortly after, assembly of the layers into the multilayered article, e.g., PV module. Crosslinking can be initiated and performed by any one of a number of different and known methods, e.g., by the use of thermally activated initiators, e.g., peroxides and azo compounds; photoinitiators, e.g., benzophenone; radiation techniques including Electron-beam and x-ray; vinyl silane, e.g., vinyl tri-ethoxy or vinyl tri-methoxy silane; and moisture cure.

The stabilized polypropylene layer in PV module backsheet of this invention exhibits (1) low flame spread of <100 as measured by ASTM E162-02a, (2) long term heat aging of greater than 105° C. as measured by Relative Thermal Index (RTI) and tested by a UL 746B standard and reflected in retention of tensile strength as measured by ASTM D882 after aging at high temperatures (e.g., 150° C.), and (3) UV stability of greater than (>) 1000 hours as reflected in >70% retention of tensile properties and good color retention (e.g., YI less than (<) 5) in Xenon Arc exposure (IEC 61730, ASTM D2565, ASTM G151, ASTM G155) or alternatively in QUV exposure (ASTM G154). Furthermore, the PV backsheets and integrated backsheets with stabilized polypropylene layer also exhibit a low flame spread index of <100 and good weatherability and long term thermal aging property.

In the stabilized polypropylene layer in PV module backsheet, the total amount of HALS is typically from 0.5 to 3.0 weight percent (wt %), the total amount of hindered hydroxybenzoate is typically from 0 to 1.5 wt %, the total amount of ortho-hydroxy triazine in the PV module backsheet is typically from 0 to 0.3 wt %), the total amount of thioester is typically from 0.1 to 0.8%.

Stabilizers

Ortho-Hydroxy Triazine Compound

The ortho-hydroxy triazine compounds that can be used in the practice of this invention are known compounds and are described in U.S. Pat. No. 6,843,939. Representative of the ortho-hydroxy triazine compounds that can be used in the practice of this invention is CYASORB™ UV-1164 (2,4-bis(2,4-dimethylphenyl)-6-(2-hydroxy-4-isooctyloxyphenyl)-1,3,5-triazine (CAS 2725-22-6)). The amount of the ortho-hydroxy triazine compound used in the polypropylene layer is typically 50 to 10,000 parts per million (ppm), more typically greater than (>) 75 to 8,000 ppm, more typically 100 to 6,000 ppm, and even more typically 100 to 4,000 ppm.

Hindered Amine Light Stabilizer (HALS)

The HALS that can be used in the practice of this invention are also known compounds and contain at least one 2,2,6,6-tetraalkylpiperdine (HALS-1) or 2,2,6,6-tetraakylpiperazinone (HALS-2) radical. These HALS are also described in U.S. Pat. No. 6,843,939, and they can be used alone or in combination with one another. If used in combination with one another, the weight ratio of one to the other can vary widely, e.g., HALS-1:HALS-2 of 1:99 to 99:1, 5:1 to 1:5, 4:1 to 1:4, 3:1 to 1:3, 2:1 to 1:2 and 1:1. Typically and preferably the HALS used in the practice of this invention are oligomeric or polymeric or have a weight average molecular weight (Mw) of at least 500 grams per mole (g/mol), more typically of at least 1,000 g/mol or even more typically of at least 1,500 g/mol.

The HALS that can be used in the practice of this invention include, but are not limited to, and available from Cytec, the following: CYASORB™ UV 3346 (1,6-hexanediamine,-N,N'-bis(2,2,6,6-tetramethyl-4-piperidinyl) (CAS No. 82451-48-7) polymers with 2,4-dichloro-6-(4-morpholinyl)-1,3,5-triazine, from Cyasorb); CYASORB™ 3529 (CAS No. 193098-40-7) 1,6-hexanediamine-N,N'-bis(2,2,6,6-tetramethyl-4-piperidinyl) polymers with morpholine-2,4,6-trichloro-1,3,5-reaction products, methylated triazine; CYASORB™ UV 3853 (CAS No. 167078-06-0) 2,2,6,6-tetramethyl-4-piperidinyl stearate; CYASORB™ THT 4611 (CAS No. 82451-48-7) 1,6-hexanediamine-N, N'-bis(2,2,6,6-tetramethyl-4-piperidinyl) polymers with 2,4-dichloro-6-(4-morpholinyl)-1,3,5-triazine and 2-[4,6-bis(2,4-dimethylphenyl)-1,3,5-triazin-2-yl]-5-(octyloxy) phenol (CAS No. 2725-22-6); CYASORB™ THT 6435 (CAS No. 193098-40-7)1,6-hexanediamine-N,N'-bis(2,2,6,6-tetramethyl-4-piperidinyl) polymers with morpholine-2,4,6-trichloro-1,3,5-triazine reaction products, methylated and 2-[4,6-bis(2,4-dimethylphenyl)-1,3,5-triazin-2-yl]-5-(octyloxy) phenol (CAS No. 2725-22-6); CYASORB CYNERGY SOLUTIONS™ R350-a4 (a blend of stabilizers comprising CYASORB™ UV-3529, CYASORB™ 1164 (an ortho-hydroxy triazine), and DOVERPHOS™ 9228 (a phosphite)); CYASORB™ R350 (a blend of stabilizers comprising CYASORB™ UV-3346, CYASORB™ UV-3529, CYASORB™ UV-2908 (a hindered hydroxybenzoate), CYASORB™ UV-1164 and CYANOX™ 1790); CYASORB™ A400 (a blend of stabilizers comprising CYASORB™ UV-3529, CYASORB™ UV-2908, and IRGAFOS™ 168 (a phosphite)); CYASORB™ A430 (a blend of stabilizers comprising CYASORB™ UV-3529, CYASORB™ UV-2908, & IRGAFOS™ 168); NOR 371 HALS (1,6-hexanediamine-N,N'-bis(2,2,6,6-tetramethyl-4-piperidinyl) polymer with 2,4,6-trichloro-1,3,5-triazine reaction products with 3-bromo-1-propene, N-butyl-1-butanamine and N-butyl-2,2,6,6-tetramethyl-4-piperidinamine, oxidized, hydrogenated) available from BASF; NOR 116 HALS (1,3-propanediamine-N,N"-1,2-ethanediylbis reaction products with cyclohexane and peroxidized N-butyl-2,2,6,6-tetramethyl-4-piperidinamine-2,4,6-trichloro-1,3,5-triazine reaction products, CAS No. 191680-81-6) available from BASF; CHIMASSORB™ 119 (1,5,8,12-tetrakis[4,6-bis(N-butyl-N-1,2,2,6,6-pentamethyl-4-piperidylamino)-1,3,5-triazin-2-yl]-1,5,8,12-tetraazadodecane (CAS No. 106990-43-6) available from BASF; CHIMASSORB™ 966 and similar structures with low melt points (see US 2012/0108711), cyclic sterically hindered amine stabilizers with four pending 2,2,6,6-tetramethyl-piperidine groups; and AZONOR bis(1-propyloxy-2,2,6,6-tetramethylpiperidyl)-4-diazine (such as described, for example, in US 2010/0144935). Blends of CYASORB™ UV 3346 and 3529 are preferred HALS.

In one embodiment a blend of CYASORB™ UV 3346 and UV 3529 is used at a weight ratio of 1:4 to 8:1, more typically of 1:3 to 6:1, even more typically of 1:2 to 5:1.

The amount of HALS used in the polypropylene layer is typically 500 to 30,000 parts per million (ppm), more typically greater than (>) 2,000 to 20,000 ppm, more typically >5,000 to 15,000 ppm, and even more typically 7,500 to 12,000 ppm.

The weight ratio of HALS to ortho-hydroxy triazine is typically 20:1 to 1:2, more typically 10:1 to 1:1, more typically 8:1 to 4:1, and even more typically 7:1 to 5:1.

Hindered Hydroxybenzoate

The hindered hydroxybenzoate compounds that can be used in the practice of this invention are also known compounds and are described in U.S. Pat. No. 6,843,939. They include, but are not limited to, CYASORB™ UV-2908 (3,5-di-tert-butyl-4-hydroxybenzoic acid, hexadecyl ester (CAS No. 67845-93-6)), and CYASORB™ UV-3853 (2,2,6,6-tetramethyl-4-piperidinyl stearate (CAS No. 167078-06-0)). CYASORB™ UV-2908 is a preferred hindered hydroxybenzoate. The amount of the hindered hydroxybenzoate compound used in the polypropylene layer is typically 500 to 25,000 parts per million (ppm), more typically greater than (>) 2,000 to 20,000 ppm, more typically >5,000 to 18,000 ppm, and even more typically 7,500 to 15,000 ppm.

The weight ratio of hindered hydroxybenzoate to HALS is typically 1:8 to 10:1, more typically 0.5:1 to 8:1, more typically 0.75:1 to 4:1, and even more typically 1:1 to 2:1.

Thioester

The thioesters that can be used in the practice of this invention are also known compounds, and they are secondary antioxidants which contain sulfur and ester groups. [Gachter/Muller, *Plastics Additives Handbook*, Hanser Publishers, 1993] The thioesters that can be used in the practice of this invention include, but are not limited to, NAUGARD™ 412S (pentaerythritol tetrakis (β-laurylthiopropionate), CAS Reg. No. 29598-76-3, from Chemtura), LOWINOX™ DSTDP (distearyl thiodipropionate, CAS No. 693-36-7 from Chemtura), dilauryl thiodipropionate, CAS No. 123-28-4, from Chemtura, and SN-1 (propanoic acid, 3-(dodecylthio)-1,1'-[oxybis(2,1-ethanediyloxy-2,1-ethanediyl)] ester, CAS No.: 64253-30-1, an antioxidant from Tiarco). NAUGARD™ 412S is a preferred thioester for use in the practice of this invention. The amount of thioester used in the polypropylene layer is typically 1,500 to 12,000 parts per million (ppm), more typically >2,000 to 10,000 ppm, more typically >2,500 to 8,000 ppm, and even more typically 3,000 to 6,000 ppm.

Flame Retardants

In certain embodiments of this invention, one or more layers of the PV module backsheet comprises a flame retardant. These flame retardants can be used alone or in combination with one another flame retardant. The flame retardants used in the practice of this invention can be confined to a single layer of the backsheet or spread across multiple or all layers of the backsheet. Typically these flame retardants are present, if present at all, in an aggregate amount, i.e., the total of all flame retardants in backsheet, from 0 to 50, more typically from 0 to 30 and even more typically from 0 to 10 wt % based on the weight of the backsheet.

Non-Halogenated Organic Compound

The non-halogenated organic compounds that can be used in the practice of this invention include, but are not limited to, melamine-containing compounds such as melamine cyanurate, melamine phosphate, melamine pyrophosphate, melamine polyphosphate, 2,4,6-triamino-1,3,5-triazine, and mixtures of piperazine pyrophosphate and melamine pyrophosphate and the like.

Halogenated, Nonphosphorus Organic Compound

Halogenated, nonphosphorus organic compounds that can be used in the practice of this invention include but are not limited to chlorinated paraffin, halogenated aromatic compounds such as pentabromotoluene, decabromodiphenyl oxide, decabromodiphenyl ethane, ethylene-bis(tetrabromophthalimide), dechlorane plus, and the like.

Halogenated Phosphorous Compound

Nonlimiting examples of suitable halogenated phosphates include the halogenated (fluoro-, chloro-, bromo- and/or iodo-) versions of triphenyl phosphate (TPP), resorcinol diphenyl phosphate (RDP), bisphenol A diphenyl phosphate, and (2,6-dimethylphenyl) 1,3-phenylene bisphosphate.

Anti-Drip Agent

The anti-drip agent prevents the composition from dripping when exposed to flame. Nonlimiting examples of suitable anti-drip agents include fluoro-resin, such as poly (tetrafluoroethylene), polyvinylidene fluoride or tetrafluoroethylene/hexafluoropropylene copolymers and ethylene/tetrafluoroethylene copolymers, TEFLON-grafted styrene-acrylonitrile copolymer (T-SAN), fluorinated polyolefin, lithium, sodium, potassium or cesium salt of 1,1,2,2-tetrafluoroethanesulfonate or 1,1,2,3,3,3-hexafluoropropanedulfonate. Further nonlimiting examples of suitable anti-drip agents includes silicone resins, silicone oil, clay, phosphoric acid, phosphorous acid, hypophosphorous acid, hypophosphoric acid, phosphinic acid, phosphonic acid, metaphosphoric acid, hexanetaphosphoric acid, thiophosphoric acid, fluorophosphoric acid, difluorophosphoric acid, fluorophosphorous acid, difluorophosphorous acid, fluorohypophosphorous acid and fluorohypophosphoric acid. The anti-drip agent may be one or more of any of the aforementioned anti-drip agents.

Additives

In one embodiment the polypropylene layer further comprises at least one of an acid scavenger, metal deactivator, primary antioxidant (such as a hindered phenol), and a secondary antioxidant (such as a hindered arylalkyl phosphate or trisarylphosphite). Representative phosphites include, but are not limited to, DOVERPHOS™ 9228 (bis(2,4-dicumylphenyl) pentaerythritol diphosphite) available from the Dover Chemical Company, and IRGAFOS™ 168 phenol,2,4-bis(1,1-dimethylethyl)-1,1',1''-phosphite (CAS No. 31570-04-4)). The amount of each additive used in the polypropylene layer is typically 100 to 4,000 parts per million (ppm), more typically 200 to 3,000 ppm, more typically 300 to 2,000 ppm, and even more typically 400 to 1,500 ppm.

The individual layers of the multilayered structure can further comprise one or more additives in addition to stabilizer additives. Other additives that can be used include anti-blocks such as diatomaceous earth, superfloss, silicates, talc, mica, wolastonite, and epoxy coated talcs, and the like; slip additives such as erucamide and stearamide and the like, polymer process aids such as Dyneon fluropolymer elastomers like DYNAMAR™ FX5930, pigments and fillers such as $TiO_2$ R960, R350, R105, R108, R104, carbon blacks such as used in Dow DNFA-0037 masterbatch or provided by Cabot. These and other potential additives are used in the manner and amount as is commonly known in the art.

Multilayer Film Structures and ED Modules

In describing the use of the polymer components above to make laminate or layered structures, there are a number of terms that are regularly used and defined as follows.

"Layer" means a single thickness, coating or stratum continuously or discontinuously spread out or covering a surface.

"Multi-layer" means at least two layers.

"Facial surface", "planar surface" and like terms as related to films or layers mean the surfaces of the layers that are in contact with the opposite and adjacent surfaces of the adjoining layers. Facial surfaces are in distinction to edge surfaces. A rectangular film or layer comprises two facial surfaces and four edge surfaces. A circular layer comprises two facial surfaces and one continuous edge surface.

"In adhering contact" and like terms mean that one facial surface of one layer and one facial surface of another layer are in touching and binding contact to one another such that one layer cannot be removed for the other layer without damage to the in-contact facial surfaces of both layers.

"Sealing relationship" and like terms mean that two or more components, e.g., two polymer layers, or a polymer layer and an electronic device, or a polymer layer and a glass cover sheet, etc., join with one another in such a manner, e.g., co-extrusion, lamination, coating, etc., that the interface formed by their joining is separated from their immediate external environment.

"Backsheet", "photovoltaic backsheet", "PV backsheet" and like terms mean the covering over the back or rear side of a PV module to protect the PV module during use and from the environment. The backsheet is typically plastic, that is in direct contact with the backside encapsulant of the PV module, where the backside encapsulant is typically in direct contact with the active elements such as crystalline silicone cells of the PV module. The backsheet can be mono- or multilayered.

"Primary antioxidant" and like terms mean free radical scavenging antioxidants which inhibit oxidation via chain terminating reactions. Typically, they have reactive OH or NH groups such as hindered phenols and secondary aromatic amines. Inhibition occurs via a transfer of a proton to the free radical species. The resulting radical is stable and does not abstract a proton from the polymer chain. Example of a primary antioxidant is Irganox 1076 available from BASF.

"Secondary antioxidant" and like terms mean hydroperoxide decomposers which decompose hydroperoxides into non-radical, non-reactive, and thermally stable products. They are often used in combination with primary antioxidants to yield synergistic stabilization effects and are usually organic molecules such as organophosphorous and sulfur-based compounds. Example of secondary antioxidant is IRGAFOS™ 168 available from BASF.

The polymeric materials as discussed above can be used in this invention to construct multilayer structure film or sheet, which is used in turn to construct and electronic device modules in the same manner and using the same amounts as is known in the art, e.g., such as those taught in U.S. Pat. No. 6,586,271, US 2001/0045229 A1, WO 99/05206 and WO 99/04971. These materials can be used to construct "skins" for the electronic device, i.e., multilayered structures for application to one or both face surfaces of the device, particularly the back surface of such devices, i.e., "backsheets". Preferably these multilayered structures, e.g., backsheets, are co-extruded, i.e., all layers of the multilayered structures are extruded at the same time, such that as the multilayered structure is formed.

Depending upon their intended use, the multilayer film or sheet structures according to the present invention can be designed to meet certain performance requirements such as in the areas of physical performance properties including toughness, transparency, tensile strength, interlayer adhesion, and heat resistance; electrical properties such as insulation, dielectric breakdown, partial discharge and resistance; reflectance; and appearance.

Layer C—Comprising High Melting Point Polyolefin Resins

In general, Layer C in the multilayer backsheet structures according to the present invention is prepared from the "Layer C High Melting Point Polyolefin Resins" as discussed above. In one preferred embodiment, it is preferably a highly crystalline homopolymer polypropylene resin. Depending upon the specific performance requirements for the film and/or a module structure in which it is intended for use, the thickness of Layer C is typically in the range of from about 100 μm to about 375 μm. As for minimum thickness, Layer C is preferably at least about 125 μm, more preferably at least about 150 μm, more preferably at least about 160 μm and most preferably at least about 170 μm thick. As for maximum thickness, the thickness of Layer C can be up to and including about 350 μm, preferably about 300 μm, more preferably about 275 μm and most preferably about 250 μm.

Layer B—Comprising Polyolefin Block Copolymer Composite Resin

In general, Layer B in the multilayer backsheet film structures according to the several embodiments of the present invention is prepared from the "Layer B Polyolefin Block Composite Resins" as discussed above. In one preferred embodiment, it is preferably a crystalline block copolymer composite resin. Depending upon the specific performance requirements for the film and/or a module structure in which it is intended for use, the thickness of Layer B is typically in the range of from about 1 μm to about 200 μm. As for minimum thickness, Layer B is only as thick as needed to tie the adjacent Layers A and C together and can preferably be at least about 2 μm, preferably at least about 3 μm, preferably at least about 4 μm, more preferably at least about 10 μm, more preferably at least about 15 μm, more preferably at least about 20 μm and most preferably at least about 25 μm thick. As for maximum thickness, the thickness and cost of Layer B are desirably minimized but are preferably up to and including about 150 μm, preferably about 100 μm, more preferably about 75 μm and most preferably up to and including about 50 μm thick.

According to the electronic device embodiment of the present invention wherein the film is a backsheet comprising Layer C and wherein Layer B performs as both tie layer and seal Layer A for lamination to the encapsulant film, Layer B would typically range in thickness from about 20 to about 250 micrometers ("μm"). In such films Layer B is only as thick as needed to adhere to Layer C and seal the backsheet to the adjacent encapsulation layer in the electronic device, preferably at least about 30 μm, preferably at least about 40 μm, and most preferably at least about 50 μm thick. As for maximum thickness, the thickness and cost of Layer B are desirably minimized but can preferably be up to and including about 225 μm, preferably about 200 μm, more preferably about 175 μm, and most preferably up to and including about 150 μm. With Layer B as a surface seal layer it is preferably a blend comprising the CBC and one or more other components such as polymer process aids, colorants, and slip or anti-block additives.

Layer A—Seal Layer

As mentioned above, in one multilayered article embodiment of the present invention, the top or seal Layer A adheres the films according to the present invention to an encapsulating film. Depending upon the specific performance requirements for the film and/or a module structure in which it is intended for use, the thickness of Layer A is typically in the range of from about 15 μm to about 200 μm. As for minimum thickness, Layer A is only as thick as needed to adhere the backsheet to the encapsulation film layer and should be at least about 17 μm, preferably at least about 20 μm, more preferably at least about 23 μm and most preferably at least about 25 μm thick. As for maximum thickness, the thickness and cost of Layer A are desirably minimized but can be up to and including about 175 μm, preferably about 150 μm, more preferably about 130 μm, and most preferably up to and including about 125 μm.

Film Structure and Thickness

The composition of the layers can be selected and optimized along the lines discussed herein depending upon the intended film structure and usage of the film structure. For example, for use in electronic device laminate structures multilayer films according the present invention, the films can be employed as a 2 layer backsheet or a 3 layer backsheet (comprising both a tie layer and a top seal layer). The films according to the present invention are suitable to be employed as, among other things, backsheet layers for direct use in laminate electronic device structures, such as, for example PV modules.

In all cases, the top facial surface of the multilayered film structure exhibits good adhesion for the facial surfaces of the encapsulation layer material that encapsulates the device.

Depending somewhat upon the specific structure and process for utilizing the film or sheet that structures according to the present invention, such film structures can be prepared by any of a large number of known film production processes including but not limited to extrusion or co-extrusion methods such as blown-film, modified blown-film, calendaring and casting, as well as sheet extrusion using a roll stack. There are many known techniques which can be employed for providing multilayer films (up to and including microlayer films), including for example in U.S. Pat. Nos. 5,094,788; 5,094,793; WO/2010/096608; WO 2008/008875; U.S. Pat. Nos. 3,565,985; 3,557,265; 3,884,606; 4,842,791 and 6,685,872. Layers A, B and C of the films according to the present invention, are selected to be adhered simultaneously together preferably by co-extrusion or alternatively but less preferably by a lamination process (such as extrusion lamination, thermal lamination, or adhesive lamination) into the films according to the invention. Alternatively but less preferably, a sequential process can be employed to adhere pairs of layers together and to the third and any optional layers.

The overall thickness of the multilayered films and, in particular backsheet structures, according to the present invention, prior to attachment to other layers such as encapsulant layers, electronic devices and/or anything else, is typically between about 50 µm and about 825 µm. Preferably to provide sufficient physical properties and performance, the film thickness is at least about 75 µm, and more preferably at least about 125 µm. To maintain light weight and low costs, but retain the requisite electrical properties, the film thickness is preferably 775 µm or less, more preferably 575 µm or less. This includes any optional, additional layers that form and are an integral part of the multilayer structure comprising layers A, B and C.

PV Module Structures and Terms

In the electronic device (and especially the PV module) embodiments of the present invention, the top layer or coversheet 13 and the top encapsulating layer 12a generally need to have good, typically excellent, transparency, meaning transmission rates in excess of 90, preferably in excess of 95 and even more preferably in excess of 97, percent as measured by UV-vis spectroscopy (measuring absorbance in the wavelength range of about 250-1200 nanometers. An alternative measure of transparency is the internal haze method of ASTM D-1003-00. If transparency is not a requirement for operation of the electronic device, then the polymeric material can contain opaque filler and/or pigment.

The thicknesses of all the electronic device module layers, described further below, both in an absolute context and relative to one another, are not critical to this invention and as such, can vary widely depending upon the overall design and purpose of the module. Typical thicknesses for protective or encapsulate layers 12a and 12b are in the range of about 0.125 to about 2 millimeters (mm), and for the cover sheet in the range of about 0.125 to about 1.25 mm. The thickness of the electronic device can also vary widely.

Light Transmitting Encapsulation Component or Layer

These layers are sometimes referred to in various types of PV module structures as "encapsulation" films or layers or "protective" films or layers or "adhesive" films or layers. So long as sufficiently light transmitting, these layers can employ the same resins and resin compositions as described above in connection with their use as Layer A for backsheet embodiments of the present invention. Typically, these layers function to encapsulate and protect the interior photovoltaic cell from moisture and other types of physical damage and adhere it to other layers, such as a glass or other top sheet material and/or a back sheet layer. Optical clarity, good physical and moisture resistance properties, moldability and low cost are among the desirable qualities for such films. Suitable polymer compositions and films include those used and in the same manner and amounts as the light transmitting layers used in the known PV module laminate structures, e.g., such as those taught in U.S. Pat. No. 6,586,271, US 2001/0045229 A1, WO 99/05206 and WO 99/04971. These materials can be used as the light transmitting "skin" for the PV cell, i.e., applied to any faces or surfaces of the device that are light-reactive.

Light Transmitting Cover Sheet

Light transmitting cover sheet layers, sometimes referred to in various types of PV module structures as "cover", "protective" and/or "top sheet" layers, can be one or more of the known rigid or flexible sheet materials. Alternatively to glass or in addition to glass, other known materials can be employed for one or more of the layers with which the lamination films according to the present invention are employed. Such materials include, for example, materials such as polycarbonate, acrylic polymers, a polyacrylate, a cyclic polyolefin such as ethylene norbornene, metallocene-catalyzed polystyrene, polyethylene terephthalate, polyethylene naphthalate, fluoropolymers such as ETFE (ethylene-tetrafluoroethylene), PVF (polyvinyl fluoride), FEP (fluoroethylene-propylene), ECTFE (ethylene-chlorotrifluoroethylene), PVDF (polyvinylidene fluoride), and many other types of plastic or polymeric materials, including laminates, mixtures or alloys of two or more of these materials. The location of particular layers and need for light transmission and/or other specific physical properties would determine the specific material selections. As needed and possible based upon their composition, the down conversion/light stabilizer formulations discussed above can be employed in the transparent cover sheets. However, the inherent stability of some of these may not require light stabilization according to the present invention.

When used in certain embodiments of the present invention, the "glass" used as a light transmitting cover sheet refers to a hard, brittle, light transmitting solid, such as that used for windows, many bottles, or eyewear, including, but not limited to, soda-lime glass, borosilicate glass, sugar glass, isinglass (Muscovy-glass), or aluminum oxynitride. In the technical sense, glass is an inorganic product of fusion which has been cooled to a rigid condition without crystallizing. Many glasses contain silica as their main component and glass former.

Pure silicon dioxide ($SiO_2$) glass (the same chemical compound as quartz, or, in its polycrystalline form, sand) does not absorb UV light and is used for applications that require transparency in this region. Large natural single crystals of quartz are pure silicon dioxide, and upon crushing are used for high quality specialty glasses. Synthetic amorphous silica, an almost 100% pure form of quartz, is the raw material for the most expensive specialty glasses.

The glass layer of the laminated structure is typically one of, without limitation, window glass, plate glass, silicate glass, sheet glass, float glass, colored glass, specialty glass which may, for example, include ingredients to control solar heating, glass coated with sputtered metals such as silver, glass coated with antimony tin oxide and/or indium tin oxide, E-glass, and SOLEXIA™ glass (available from PPG Industries of Pittsburgh, PA).

Laminated PV Module Structures

The methods of making PV modules known in the art can readily be adapted to use the multilayer backsheet film structures according to present invention. For example, the multilayer backsheet film structures according to present invention can be used in the PV modules and methods of making PV modules such as those taught in U.S. Pat. No. 6,586,271, US 2001/0045229 A1, WO 99/05206 and WO 99/04971.

In general, in the lamination process to construct a laminated PV module, at least the following layers are brought into facial contact:
  A. A light-receiving top sheet layer (e.g., a glass layer) having an "exterior" light-receiving facial surface and an "interior" facial surface;
  B. A front light transmitting thermoplastic polymer film having at least one layer of light transmitting thermoplastic polymers comprising the down conversion/light stabilizer formulations according to present invention, having one facial surface directed toward the glass and one directed toward the light-reactive surface of the PV cell and encapsulating the cell surface, provided that this layer can be optional in some module structures where the PV cell material may be directly deposited on the light receiving layer (e.g., glass);
  C. APV cell;
  D. A second encapsulating film layer; and
  E. A back layer comprising glass or other back layer substrate.

With the layers or layer sub-assemblies assembled in desired locations the assembly process typically requires a lamination step with heating and compressing at conditions sufficient to create the needed adhesion between the layers and, if needed in some layers or materials, initiation of their crosslinking. If desired, the layers may be placed into a vacuum laminator for 10 to 20 minutes at lamination temperatures in order to achieve layer-to-layer adhesion and, if needed, crosslinking of the polymeric material of the encapsulation element. In general, at the lower end, the lamination temperatures need to be at least about 130° C., preferably at least about 140° C. and, at the upper end, less than or equal to about 170° C., preferably less than or equal to about 160° C.

The invention is further described by the following examples in which all parts and percentages are by weight unless otherwise indicated.

SPECIFIC EMBODIMENTS

Experimental multilayer sample films (film layers indicated by letters, e.g., A, B and C) are made using the thermoplastic resin materials reported in Tables 1 and 2. Where indicated, the melt flow rates (MFR) are measured according to ASTM D1238 (230° C./2.16 kg) and reported in grams per 10 minutes (g/10 min) and melt index values (MI) are measured according to ASTM D1238 (190° C./2.16 kg) and reported in g/10 min. The density is measured according to ASTM D792 and given in grams per cubic centimeter (g/cc). The polypropylene polyolefins all have at least one melting peak greater than 125° C. and heat of fusion values greater than 60 J/g.

TABLE 1

Resins Used in the Examples

| Resin | Product name | Resin Supplier | MFR/MI | Density ASTM D792 (g/cc) |
|---|---|---|---|---|
| PP 1 | PRO-FAX ™ 6301 PP | Lyondell-Basell | 12 MFR | 0.900 |
| PP 2 | D118.01 PP | Braskem | 8.0 MFR | 0.900 |
| PP 3 | INSPIRE ™ 404 | Braskem | 3.0 MFR | 0.900 |
| LLDPE 1 | DOWLEX ™ 2247G | Dow | 2.3 MI | 0.917 |
| LLDPE 2 | GRSN 9820 NAT LLDPE | Dow | 20 MI | 0.924 |
| Plastomer | AFFINITY ™ PL 1880G | Dow | 1.0 MI | 0.902 |
| PP-gMAH | OREVAC ™ CA100 | Arkema | 150 MFR | 0.910 |
| E-GMA | LOTADER ™ AX8840 | Arkema | 5 MI | 0.940 |
| CBC | CBC 11C06R04 | Dow | 6.5 MFR | 0.905 |
| EEA | AMPLIFY ™ EA 100 | Dow | 1.3 MI | 0.930 |
| EVA | ELVAX ™ 3128 (8.9% VA) | DuPont | 2 MI | 0.930 |
| LDPE-gMAH | AMPLIFY ™ GR-202 (1.2% MAH) | Dow | 8 MI | 0.930 |

The crystalline block copolymer composites (CBC's) below are prepared as described above and are reported in Table 2. They have the following general characteristics:
(1) An ethylene-based polymer (EP) that is crystalline (CEP);
(2) A propylene-based crystalline polymer (CPP), and
(3) A block copolymer comprising
  (A) An ethylene polymer block (EB) that is a crystalline ethylene block CEB), and
  (B) A crystalline propylene polymer block (CPPB).

As also shown in Table 2, the CBC samples are further characterized as follows:
Wt % PP—Weight percentage propylene polymer in the CBC as measured by high temperature liquid chromatography (HTLC) separation as described above.
Mw—Weight average molecular weight of the CBC in Kg/mol as determined by gel permeation chromatography (GPC) as described above.
Mw/Mn—Molecular weight distribution of the CBC as determined by GPC as described above.
Wt % $C_2$ in CBC—Weight percentage of ethylene in the CBC as determined by nuclear magnetic resonance (NMR), the balance propylene.
Tm (° C.) Peak 1 (Peak 2)—Peak melting temperature as determined by the second heating curve from differential scanning calorimetry (DSC). Peak 1 refers to the melting of CPPB or CPP, whereas Peak 2 refers to the melting of CEB or CEP.
Tc (° C.)—Peak crystallization temperature as determined by DSC cooling scan.
Heat of Fusion (J/g)—Heat of fusion of the CBC measured as described above.
Mol % $C_2$ in CEB—Mole percentage of ethylene in the crystalline ethylene block component (3)(A) (and also the crystalline ethylene polymer component (1) of the CBC), the balance of comonomer in both cases propylene.
Wt % CPPB in block copolymer—Weight percentage of crystalline propylene polymer in the block copolymer component (3).
CBCI—Crystalline block copolymer composite index which reflects the content of the block copolymer (iii) in the CBC composition.

TABLE 2

CBC Resin Used in Experimental Film

| Resin | MFR | Density (g/cc) | Wt % PP | Mw Kg/mol | Mw/Mn | Wt % $C_2$ In CBC | Tm (° C.) Peak 1 (Peak 2) | Tc (° C.) | Heat of fusion (J/g) | Mol % $C_2$ in CEB | Wt % CPPB in (iii) | CBCI |
|---|---|---|---|---|---|---|---|---|---|---|---|---|
| CBC 5 11C06R04 | 6.3 | 0.9060 | 17.0 | 116 | 2.9 | 48.5 | 129 (107) | 91 | 94 | 93 | 50 | 0.633 |

As also further indicated in Tables 3 and 4, other commercially available additives and stabilizers are employed in the formulation.

TABLE 3

Masterbatches

| Masterbatch | Supplier | Product | Carrier | Active species |
|---|---|---|---|---|
| AB 1 | Ampacet | AMPACET ™ 10799A | polyethylene | Talc |
| AB 2 | Ampacet | AMPACET ™ 101736 | polyethylene | Diatomaceous Earth |
| S/AB | Ampacet | AMPACET ™ 102854 | polyethylene | Slip & Antiblock |
| White 1 | Ampacet | AMPACET ™ 110456 | polyethylene | TiO2 |
| White 2 | Ampacet | AMPACET ™ 110443 | polyethylene | TiO2 |
| White 3 | Ampacet | AMPACET ™ 110883-A | polypropylene | TiO2 |
| UV 1 | Dow | Table 3 | polyethylene | UV stabilizer |
| PPA | Ampacet | AMPACET ™ 102823 | polyethylene | polymer process aid |
| FR 1 | Clariant | CESA ™-flam MB CT-1629NH | polypropylene | Halogen free FR |
| FR 2 | Clariant | AMPACET ™ LR 183764 | polypropylene | Halogenated FR |
| EC 1 | Dow | PCN-727 | polyolefin | Encapsulant 1 |
| EC 2 | Dow | PCN-719 | polyolefin | Encapsulant 2 |
| UV 7 | Dow | PCN-639 | polyolefin | UV stabilizer |

TABLE 4

UV Stabilizer Masterbatch Formulation

| Component | Type of additive | Supplier | UV 1 (Wt %) |
|---|---|---|---|
| LDPE2 | Resin | Dow Chemical | 89.5 |
| CYASORB ™ UV1164 | UV stabilizers | Cytec Industries, Inc | 1.0 |
| CYASORB ™ UV3853S | UV stabilizers | Cytec Industries, Inc | 4.0 |
| CYASORB ™ UV3346 | UV stabilizers | Cytec Industries, Inc | 2.0 |
| CYASORB ™ UV3529 | UV stabilizers | Cytec Industries, Inc | 2.0 |
| IRGANOX ™ 1010 | Antioxidant | BASF Corporation | 0.75 |
| IRGANOX ™ 168 | Antioxidant | BASF Corporation | 0.75 |

The films are prepared using the indicated processing conditions in Tables 5-8 on cast/sheet film lines using a standard type of feedblock configuration with a 30.5 centimeter (cm) wide die (mini), 76.2 cm wide die (pilot) or 152 cm wide die (N1) to produce either monolayer or three-layer film.

TABLE 5

Fabrication Conditions for Experimental Monolayer Cast Films 1-6

| 30 cm die/Extruder B Temperatures | Ex. 1 to 3 | Ex. 4 | Ex. 5, 6 |
|---|---|---|---|
| Feed zone, ° C. | 204 | 210 | 202 |
| Zone 2, ° C. | 207 | 227 | 204 |
| Zone 3, ° C. | 210 | 232 | 207 |
| Zone 4, ° C. | 210 | 238 | 210 |
| Transfer line, screen, adapters, ° C. | 210 | 238 | 210 |
| Feedblock, ° C. | 210 | 221 | 210 |
| Die, ° C. | 210 | 221 | 210 |
| Cast roll, ° C. | 93 | 104 | 104 |

TABLE 6

Fabrication Conditions for Experimental Multilayer Cast Films 11-13

| | Pilot Cast Line - 76 cm die ||||||||| 
|---|---|---|---|---|---|---|---|---|---|
| | Ex. 11 ||| Ex. 12 ||| Ex. 13 |||
| Layer | A | B | C | A | B | C | A | B | C |
| Extruder | 4 | 3 | 1 | 4 | 3 | 1 | 4 | 3 | 1 |
| RPM | 22 | 12 | 98 | 22 | 12 | 98 | 22 | 12 | 98 |
| Feed zone, ° C. | 188 | 182 | 202 | 188 | 182 | 202 | 188 | 182 | 202 |
| Zone 2, ° C. | 191 | 188 | 210 | 191 | 188 | 210 | 191 | 188 | 210 |
| Zone 3, ° C. | 193 | 199 | 216 | 193 | 199 | 216 | 193 | 199 | 216 |
| Zone 4, ° C. | 193 | 199 | 216 | 193 | 199 | 216 | 193 | 199 | 216 |
| Transfer line, screen, adapters, ° C. | 191 | 199 | 216 | 191 | 199 | 216 | 191 | 199 | 216 |
| Feedblock, ° C. | | | 216 | | | 216 | | | 216 |
| Die, ° C. | | | 216 | | | 216 | | | 216 |
| Cast roll, ° C. | | | 93 | | | 93 | | | 93 |

TABLE 7

Fabrication Conditions for Experimental Monolayer Cast Films 14

| Pilot Cast Line Conditions - 76 cm Die | Ex. 14 |
|---|---|
| Extruder | 1 |
| RPM | 80 |
| Feed zone, ° C. | 201.7 |
| Zone 2, ° C. | 210.0 |
| Zone 3, ° C. | 215.6 |
| Zone 4, ° C. | 215.6 |
| Transfer line, screen, adapters, ° C. | 215.6 |
| Feedblock, ° C. | 215.6 |
| Die, ° C. | 215.6 |
| Cast roll, ° C. | 200 |

TABLE 8

Fabrication Conditions for Experimental Multilayer Films 16 and 17

| | Line N1 (152 cm die) Temperatures | | | | | |
|---|---|---|---|---|---|---|
| | Ex. 16 | | | Ex. 17 | | |
| Layer | C | A | B | B | A | C |
| Feed zone, ° C. | 171 | 143 | 185 | 138 | 149 | 160 |
| Zone 2, ° C. | 185 | 160 | 199 | 149 | 166 | 171 |
| Zone 3, ° C. | 185 | 185 | 199 | 166 | 191 | 193 |
| Zone 4, ° C. | 199 | 199 | 199 | 177 | 191 | 193 |
| Zone 5, ° C. | 199 | 199 | 199 | 177 | 191 | 193 |
| Flange - Zone 6, ° C. | 199 | 199 | 199 | 177 | 191 | 193 |
| Screen Change - Zone 7, ° C. | 199 | 199 | 199 | 177 | 191 | 193 |
| Transfer Line 1 - Zone 8, ° C. | 199 | 199 | 199 | 177 | 191 | 193 |
| Transfer Line 2 - Zone 9, ° C. | 199 | 199 | 199 | 177 | 191 | 193 |
| Transfer Line 3 - Zone 10, ° C. | 199 | 199 | 199 | 199 | 199 | 199 |
| Feedblock, ° C. | | | 199 | 188 | | |
| Die, ° C. | | | 199 | 188 | | |
| Three roll stack (top/middle/bottom), ° C. | 14 | 91 | 52 | 27 | 13 | 24 |

The comparative examples are 4 and 10 (PROTEKT™ HD PV backsheet consisting of a three layer film (PROTEKT™/PET/EVA) and obtained from Madico of Woburn, MA), and 5, 9 and 15 (FORMEX™ GK10 purchased from ITW Formex as a 250 millimeter (mm) monolayer electrical insulation polypropylene film serving as a standard PP film used in RTI UL746B, having excellent LTHA capability defined by an RTI rating of 115° C. and a UL-94 flammability rating of VTM-0).

Tensile testing (ASTM D822) is done in the machine direction (MD) of the samples. 250 mm×25 mm MD strips (2 samples) of film are cut and clamped to hang vertically in air ovens. Samples are tested using 4 repeats on an Instron tensile tester at 50 mm/min using a 5 mm gap and line grips.

Accelerated weathering is done exposing the polypropylene layer either in a QUV chamber according to ASTM G154 using an A340 bulb, 0.68 Watts/m² irradiance and no dark cycle or it is performed in a Xenon Arc according to ASTM D2565 with no water spray, 89° C. black panel temperature, 0.55 watts/m² @340 nm, 50% Relative humidity, a boro/boro filter configuration and constant light. After samples weathered in time they are removed and tested for tensile properties or color (yellowness index) ASTM E313.

Dielectric strength testing ASTM D149 is done on 125 mm×125 mm samples hung vertically in air oven aging. Duplicates are run.

Flame spread index is measured at INTERTEK according to ASTM E162-02a on samples with dimension of 150 mm×450 mm, 5 repeats and with heat source in line of sight to PP side of the films.

TABLE 9

Formulations in Wt % for Examples 1-5

| | Ex. 1 | Ex. 2 | Ex. 3 | Comparative Ex. 4 | Comparative Ex. 5 |
|---|---|---|---|---|---|
| Sample ID # | 3335-6 | 3335-7 | 3335-8 | PROTEKT ™ HD | FORMEX ™ GK10 - 200803151-25 |
| Thickness, mm | 190.5 | 190.5 | 190.5 | 254 | 254 |
| PP 3 | 67.1 | 52.1 | 65.6 | | |
| PP 1 | 10.1 | 10.1 | 11.4 | | |
| LLDPE 2 | 1.85 | 1.85 | 1.85 | | |

TABLE 9-continued

Formulations in Wt % for Examples 1-5

|  | Ex. 1 | Ex. 2 | Ex. 3 | Comparative Ex. 4 | Comparative Ex. 5 |
|---|---|---|---|---|---|
| Plastomer | 10.0 | 25.0 | 10.0 | | |
| White 2 | 8.0 | 8.0 | 8.0 | | |
| NAUGARD ™ 412S | 0.25 | 0.25 | 0.40 | | |
| CYNERGY ™ R350 | 2.6 | 2.6 | 2.6 | | |
| CYANOX ™ 2777 | 0.15 | 0.15 | 0.15 | | |

TABLE 10

Property Retention with Oven and QUA Exposure vs. Time for Examples 1-5

|  | Ex. 1 | Ex. 2 | Ex. 3 | Comparative Ex. 4 | Comparative Ex. 5 |
|---|---|---|---|---|---|
| OVEN AGING - % Retention of Ultimate Tensile MD | | | | | |
| Time (hr) | | | 155 C. | | |
| 0 | 100 | 100 | 100 | 100 | 100 |
| 262 | 67 | 93 | 97 | 72 | 70 |
| 528 | 68 | 99 | 97 | sample melted | 6 |
| 1008 | 66 | 74 | 94 | — | 0 |
| Time (hr) | | | 145 C. | | |
| 0 | 100 | 100 | 100 | — | 100 |
| 528 | 67 | 91 | 114 | — | 70 |
| 1008 | 88 | 100 | 95 | — | 63 |
| 1512 | 66 | 100 | 97 | — | — |
| 2016 | 69 | 100 | 99 | — | — |
| 3024 | 63 | 48 | 100 | — | — |
| Time (hr) | | | 135 C. | | |
| 0 | 100 | 100 | 100 | — | 100 |
| 1008 | 66 | 82 | 116 | — | 71 |
| 2016 | 68 | 95 | 98 | — | — |
| 3024 | 34 | 77 | 71 | — | — |
| 4032 | 64 | 69 | 93 | — | — |
| 5040 | 53 | 56 | 95 | — | — |
| OVEN AGING - %Retention of Dielectric Strength at 155 C. | | | | | |
| 528 hr | 112 | 93 | 98 | 100 | — |
| Time (hr) | QUV - % Retention of Elongation | | | | |
| 0 | 100 | 100 | 100 | 100 | 100 |
| 1000 | 102 | 98 | 104 | 84 | 15 |
| 2000 | 93 | 97 | 86 | 78 | 20 |
| 5000 | 102 | 104 | 81 | 87 | — |
| 8000 | 89 | 102 | 81 | 92 | — |
| 15000 | 93 | 91 | 42 | 87 | — |
| Time (hr) | QUV - % Retention of Ultimate Tensile | | | | |
| 0 | 100 | 100 | 100 | 100 | 100 |
| 1000 | 98 | 95 | 96 | 73 | 64 |
| 2000 | 101 | 103 | 102 | 80 | 61 |
| 5000 | 80 | 86 | 83 | 87 | 60 |
| 8000 | 87 | 92 | 131 | 88 | — |
| 15000 | 79 | 74 | 73 | 83 | — |
| Time (hr) | QUV – Δ YI | | | | |
| 0 | 0 | 0 | 0 | 0 | 0 |
| 1000 | 1.7 | 2.3 | 1.7 | −0.9 | 63.5 |
| 2000 | 1.8 | 2.4 | 2.1 | −1.0 | 63.1 |
| 5000 | 2.7 | 3.2 | 3.4 | −0.9 | 66.3 |
| 8000 | 3.9 | 3.2 | 5.2 | −0.1 | — |
| 15000 | 4.4 | 4.5 | 5.3 | −0.2 | — |

TABLE 11

Formulations in Wt % for Examples 6-10

|  | Ex. 6 | Ex. 7 | Ex. 8 | Comparative Ex. 9 | Comparative Ex. 10 |
|---|---|---|---|---|---|
| Sample ID # | 3339-3A | 3339-9B | 3339-14B | GK10 - 200803151-25 (ITW FORMEX ™) | PROTEKT ™ HD |
| Thickness, mm | 190.5 | 190.5 | 190.5 | 254 | 254 |
| PP 3 | 59.6 | 56.1 | 48.6 | | |
| PP 1 | 11.4 | 11.4 | 11.4 | | |
| LLDPE 2 | 1.85 | 1.85 | 1.85 | | |
| Plastomer | 16.0 | 16.0 | 14.0 | | |
| White 2 | 8.0 | 8.0 | 8.0 | | |
| NAUGARD ™ 412S | 0.4 | 0.4 | 0.4 | | |
| CYNERGY ™ R350 | 2.6 | 2.6 | 2.6 | | |
| CYANOX ™ 2777 | 0.15 | 0.15 | 0.15 | | |
| FR 1 | | 3.5 | | | |
| FR 2 | | | 13.0 | | |

Stabilized PP monolayers of Example 2 and 3 have much better long term thermal stability and weatherability than Comparative Example 1. Their tensile property retention at 155C, 145C and 135C is much longer than that of Ex 1. They also have excellent tensile strength and elongation retention and low color after more than 15000 hrs QUV exposure. After 1000 hours QUV exposure, the retention of elongation of Ex 1 drops to around 15 to 20% and the YI increases to about 63.

TABLE 12

Property Retention with Oven and QUA Exposure vs. Time for Examples 6-10

| | Ex. 6 | Ex. 7 | Ex. 8 | Comparative Ex. 9 | Comparative Ex. 10 |
|---|---|---|---|---|---|
| Time (hr) | OVEN AGING @ 155 C. - % Retention of Ultimate Tensile | | | | |
| 0 | 100 | 100 | 100 | 100 | |
| 262 | 101 | 99 | 98 | 121 | |
| 528 | 102 | 95 | 98 | 0 | |
| 1008 | 106 | 69 | 100 | 0 | |
| Time (hr) | OVEN AGING @ 155 C. - % Retention of Elongation | | | | |
| 0 | 100 | 100 | 100 | 100 | |
| 262 | 63 | 4.0 | 3.1 | 76 | |
| 528 | 60 | 2.1 | 3.1 | 0 | |
| 1008 | 56 | 0.5 | 3.4 | 0 | |

TABLE 12-continued

Property Retention with Oven and QUA Exposure vs. Time for Examples 6-10

| Time (hr) | QUV - % Retention of Elongation | | | | |
|---|---|---|---|---|---|
| 0 | 100 | 100 | 100 | | 100 |
| 504 | 91 | 91 | 81 | | 47 |
| 1000 | 91 | 92 | 27 | | 114 |
| 2000 | 97 | 97 | 11 | | 6 |
| Time (hr) | QUV - % Retention of Ultimate Tensile | | | | |
| 0 | 100 | 100 | 100 | | 100 |
| 504 | 99 | 96 | 106 | | 92 |
| 1000 | 92 | 98 | 99 | | 117 |
| 2000 | 97 | 102 | 100 | | 79 |
| Time (hr) | QUV – Δ YI | | | | |
| 0 | 0 | 0 | 0 | | 0 |
| 504 | 1.4 | 0.9 | 4.9 | | −0.4 |
| 1000 | 1.6 | 0.9 | 5.4 | | −0.9 |
| 2000 | 2.0 | 0.4 | 5.9 | | 0.6 |

Ex. 11 and 12 are PV backsheet and back-encapsulant composite having PP monolayer with UV 5 with CYASORB CYNERGY SOLUTIONS™ R350. Ex. 13 and 14 are PV backsheet and back-encapsulant composite having PP monolayer with UV 7 with CYASORB CYNERGY SOLUTIONS™ R350-4a. These examples showed excellent weatherability. The tensile strength retention is above 80% and YI is excellent after 2000 hrs of Xenon Arc exposure.

TABLE 13

Formulations in Wt % for Examples 11-13

| | Ex. 11 | | | Ex. 12 | | | Ex. 13 | | |
|---|---|---|---|---|---|---|---|---|---|
| Sample ID # | | | | | | | | | |
| | PCL3345-6 | | | PCL3345-7 | | | PCL3345-10 | | |
| ASTM E162-02a Flame spread index | | | | | | | | | |
| | 80 | | | 119 | | | 100 | | |
| Layer | A | B | C | A | B | C | A | B | C |
| Thickness, mm | 380 | | | 380 | | | 380 | | |
| Layer vol % | 15 | 15 | 70.0 | 15 | 15 | 70.0 | 15 | 15 | 70.0 |
| PP 1 | | | 11.4 | | | 11.4 | | | 11.4 |
| PP 2 | | | 18.8 | | | 17.0 | | | 15.3 |
| PP 3 | | | 18.8 | | | 17.1 | | | 15.3 |
| PP-gMAH | | | 15 | | | 15 | | | 15 |
| Plastomer | | | 23 | | | 23 | | | 23 |
| E-GMA | | 70.5 | | | 70.5 | | | 70.5 | |
| CYNERGY ™ A430 | 1.5 | 1.5 | | 1.5 | 1.5 | | 1.5 | 1.5 | |
| CYANOX ™ 2777 | 0.15 | 0.15 | 0.15 | 0.15 | 0.15 | 0.15 | 0.15 | 0.15 | 0.15 |
| CYNERGY ™ R350 | | | 2.6 | | | 2.6 | | | 2.6 |
| NAUGARD ™ 412S | | | 0.4 | | | 0.4 | | | 0.4 |
| FR 1 | | | | | | 3.5 | | | |
| FR 2 | | | | | | | | | 7 |
| EVA | 59.0 | | | 59.0 | | | 59.0 | | |
| LDPE-gMAH | 10.0 | | | 10.0 | | | 10.0 | | |
| LLDPE 2 | 7.85 | 7.85 | 1.85 | 7.85 | 7.85 | 1.85 | 7.85 | 7.85 | 1.85 |
| White 1 | | 20 | | | 20 | | | 20 | |
| White 2 | | | 8 | | | 8 | | | 8 |
| PPA | 5.0 | | | 5.0 | | | 5.0 | | |
| S/AB | 1.5 | | | 1.5 | | | 1.5 | | |

TABLE 14

Formulation in Wt % for Example 14

| PP layer in Ex 16 Backsheet & Ex 17 Back-encapsulant composite | Ex. 14 |
|---|---|
| Sample | PCL 3360-1 |
| Thickness, mm | 190.5 |
| PP 2 | 63.95 |
| Plastomer | 23.0 |
| NAUGARD ™ 412S | 0.4 |
| CYASORB CYNERGY SOLUTIONS ™ R350 | 2.5 |
| CYANOX ™ 2777 | 0.15 |
| White 3 | 8.0 |
| PPA | 2.0 |

TABLE 15

Tensile Retention with Heat Aging for Examples 14 and 15

| Aging temperature (C.) | Aging time (hr) | Ex. 14 | Comparative Ex. 15 FORMEX ™ GK10 - 200803151-25 |
|---|---|---|---|
| | | % Retention of maximum tensile strength | |
| 150 C. | 0 | 100 | 100 |
| | 480 | 93 | 130 |
| | 700 | 93 | 50 |
| | 1000 | 93 | 0 |
| | 1496 | 89 | |
| | 1999 | 95 | |
| | 2501 | 95 | |
| | 3024 | 84 | |
| | 3505 | 44 | |

TABLE 16

Formulations in Wt % for Examples 16 and 17

| | Ex. 16 XUR 201002029-29-3 Backsheet | | | Ex. 17 XUR 201002029-30-7 Back-encapsulant composite | | |
|---|---|---|---|---|---|---|
| Thickness, Microns | 381 | | | 762 | | |
| Extruder | C | A | B | B | A | C |
| Layer vol % | 22.5% | 15% | 62.5% | 64.0% | 8% | 28.0% |
| PP1 | | | 9.2 | | | 9.2 |
| PP 2 | | | 54.6 | | | 54.6 |
| Plastomer | | | 23 | | | 23 |
| White 3 | | | 8 | | | 8 |
| NAUGARD ™ 412S | | | 0.4 | | | 0.4 |
| CYNERGY ™ R350 | | | 2.6 | | | 2.6 |
| CYANOX ™ 2777 | | 0.15 | 0.15 | | 0.15 | 0.15 |
| CYNERGY ™ A430 | | 1.5 | | | 1.5 | |
| CBC 5 | | 77 | | | 77 | |
| White 1 | | 20 | | | 20 | |
| UV 1 | 10 | | | | | |
| PPA | 4 | | 2 | | | 2 |
| EEA | 20 | | | | | |
| LLDPE 1 | 52.5 | | | | | |
| LLDPE 2 | | 1.35 | | | 1.35 | |
| AB 2 | 12 | | | | | |
| S/AB | 1.5 | | | | | |
| EC 1 | | | | 45 | | |
| EC 2 | | | | 45 | | |
| UV 7 | | | | 10 | | |

TABLE 17

Property Retention under Xenon Arc Exposure for Examples 16 and 17

| Xenon Arc on PP side | Time (hr) | % retention of tensile strength at break | YI of PP side |
|---|---|---|---|
| Ex. 16 | 0 | 100 | 3 |
|  | 1000 | 98 | 3.5 |
|  | 2000 | 82 | 3.4 |
| Ex. 17 | 0 | 100 | 2.7 |
|  | 1000 | 96 | 3 |
|  | 2000 | 81 | 2.8 |

TABLE 18

Radiant Panel Testing for Examples 16 and 17
ASTM E162-02a Flame spread index

| Ex. 16 | 40 |
|---|---|
| Ex. 17 | 50 |

The flame spread index of backsheet given in Ex. 8 which has FR agent added show similar flame spread index to Ex. 7 that did not have FR agents added. Ex. 10 to 15 show flame spread index of 100 or below required by IEC for PV modules.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A polyolefin photovoltaic (PV) backsheet comprising:
   an optional seal layer (A);
   an optional tie layer (B); and
   a layer (C) composed of a first polypropylene and a second polypropylene different than the first polypropylene, the first polypropylene and the second polypropylene each having a melting point greater than 125° C.;
   the layer (C) stabilized with
   (A) from 0.5 wt % to 3.0 wt % of at least one hindered amine comprising a radical selected from the group consisting of a 2,2,6,6-tetraalkylpiperidine having a triazine moiety, a 2,2,6,6-tetraakylpiperazinone radical having a triazine moiety, and combinations thereof,
   (B) from 3,000 ppm to 6,000 ppm of a thioester,
   (C) from 7,500 ppm to 15,000 ppm of at least one hindered hydroxybenzoate that is 3 5-di-tert-butyl-4-hydroxybenzoic acid, hexadecyl ester, and
   (D) from 100 ppm to 4,000 ppm of an ortho hydroxyl triazine compound, wherein weight percent of (A), (B), (C), and (D) is based on total weight of the layer (C); and
   the layer (C) is void of flame retardant agents and has a flame spread index less than 100 as measured in accordance with ASTM E162-02a.

2. The PV backsheet of claim 1 wherein the first polypropylene and the second polypropylene each have a heat fusion of at least 60 J/g.

3. The PV backsheet of claim 2 further comprising a third polypropylene different than the first polypropylene and different than the second polypropylene, the third polypropylene having a melting point greater than 125° C.

4. The PV backsheet of claim 1 wherein the layer (C) further comprises a polyolefin other than polypropylene.

5. The PV backsheet of claim 4 wherein total amount of the first polypropylene and the second polypropylene is 55 to 77.2 wt % based on total weight of the layer (C).

6. The PV backsheet of claim 5 wherein the polyolefin is selected from the group consisting of linear low density polyethylene and plastomer.

7. The PV backsheet of claim 5 wherein the layer (C) comprises a first polyolefin and a second polyolefin, each polyolefin different than polypropylene and the second polyolefin different than the first polyolefin.

8. The PV backsheet of claim 7 wherein the first polyolefin is a linear low density polyethylene and the second polyolefin is a plastomer.

9. The PV backsheet of claim 1 wherein the PV backsheet is a monolayer film consisting of layer (C), the monolayer film having a thickness from 100 microns to 375 microns.

10. The PV backsheet of claim 1 wherein the triazine moiety is oligomeric, polymeric or has a weight average molecular weight (Mw) of at least 500.

11. The PV backsheet of claim 10 wherein the layer (C) further comprises at least one of an acid scavenger, metal deactivator, primary antioxidant, and a secondary antioxidant.

12. The PV backsheet of claim 1 wherein a weight ratio of (C) the at least one hindered hydroxybenzoate to (A) the at least one hindered amine is from 0.25:1 to 3:1.

13. The PV backsheet of claim 1 wherein the tie layer (B) is present and the tie layer (B) contains a component selected from the group consisting of ethylene-glycidyl (meth)acrylate and crystalline block copolymer.

14. The PV backsheet of claim 13 wherein the tie layer contains the crystalline block copolymer and the crystalline block copolymer comprises
   (i) a crystalline ethylene-based polymer (CEP);
   (ii) a propylene-based crystalline polymer (CPP); and
   (iii) a block copolymer comprising
      (A) an ethylene polymer block (EB) that is a crystalline ethylene block; and
      (B) a crystalline propylene polymer block (CPPB).

15. The PV backsheet of claim 13 wherein the seal layer (A) is present.

16. The PV backsheet of claim 1 wherein the seal layer (A) is present and the tie layer (B) is present.

17. The PV backsheet of claim 16 wherein the seal layer comprises an ethylene-based polymer.

18. The PV backsheet of claim 17 wherein the tie layer (B) contains a component selected from the group consisting of ethylene-glycidyl (meth)acrylate and crystalline block copolymer.

19. The PV backsheet of claim 18 wherein the tie layer (B) contains the crystalline block copolymer and the crystalline block copolymer comprises
   (i) a crystalline ethylene-based polymer (CEP);
   (ii) a propylene-based crystalline polymer (CPP); and
   (iii) a block copolymer comprising
      (A) an ethylene polymer block (EB) that is a crystalline ethylene block; and
      (B) a crystalline propylene polymer block (CPPB).

* * * * *